US010772223B2

(12) United States Patent
Pedoeem et al.

(10) Patent No.: US 10,772,223 B2
(45) Date of Patent: *Sep. 8, 2020

(54) DAMPENED GRAVITY RETRACTOR

(71) Applicant: CRESTRON ELECTRONICS, INC., Rockleigh, NJ (US)

(72) Inventors: Albert Pedoeem, West Orange, NJ (US); Kriss Replogle, Brookside, NJ (US)

(73) Assignee: CRESTRON ELECTRONICS, INC., Rockleigh, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/169,410

(22) Filed: Oct. 24, 2018

(65) Prior Publication Data
US 2019/0166707 A1 May 30, 2019

Related U.S. Application Data

(63) Continuation-in-part of application No. 15/828,213, filed on Nov. 30, 2017.

(51) Int. Cl.
| | |
|---|---|
| H05K 5/02 | (2006.01) |
| B65H 75/36 | (2006.01) |
| H05K 5/03 | (2006.01) |
| A47B 21/06 | (2006.01) |
| H02G 11/00 | (2006.01) |

(Continued)

(52) U.S. Cl.
CPC ......... *H05K 5/0217* (2013.01); *B65H 75/368* (2013.01); *H05K 5/0247* (2013.01); *A47B 21/06* (2013.01); *A47B 2021/066* (2013.01); *A47B 2097/003* (2013.01); *A47B 2200/008* (2013.01); *B65H 75/446* (2013.01); *B65H 2701/3919* (2013.01); *H02G 11/003* (2013.01); *H05K 5/03* (2013.01)

(58) Field of Classification Search
CPC .............. B65H 75/4402; B65H 75/368; B65H 75/4471; B65H 2701/3919; H02G 11/003; H01R 13/72; H01R 27/02; H01R 13/518; H01R 35/04; H01R 23/25; H01R 31/06; H01R 13/447; H01R 13/5213; H01R 13/4534; A47B 21/06
See application file for complete search history.

(56) References Cited

U.S. PATENT DOCUMENTS

| | | | | |
|---|---|---|---|---|
| 4,161,682 A | * | 7/1979 | Corvette | H02J 7/0042 242/388.9 |
| 4,174,816 A | * | 11/1979 | Olson | A61B 90/50 242/272 |

(Continued)

*Primary Examiner* — William A. Rivera

(57) ABSTRACT

A cable retractor enclosure having a weighted cable pulley and cable pulley guide rails. The cable pulley is rotatable about a pivot and configured to translate along grooves when a cable wrapped underneath is extracted from the cable retractor enclosure. The cable extends outside of the retractor enclosure from its upper end and provides a cable end plug that sits within a retractor module insert. Weights may be attached to the cable pulley in order to leverage gravitational forces, which result in a bias causing the cable to retract back into the enclosure. Friction forces against the extracted cable can be used to prevent the gravitational bias the cable pulley exerts (retraction forces) on the cable by bending the cable to lay flat onto a table surface.

13 Claims, 50 Drawing Sheets

(51) Int. Cl.
  *A47B 97/00* (2006.01)
  *B65H 75/44* (2006.01)

(56) References Cited

U.S. PATENT DOCUMENTS

| | | | | |
|---|---|---|---|---|
| 5,117,859 A * | 6/1992 | Carlson | ................ | B65H 75/368 |
| | | | | 137/355.25 |
| 5,421,530 A * | 6/1995 | Bertagna | .............. | B65H 75/368 |
| | | | | 242/388.91 |
| 6,216,834 B1 | 4/2001 | Steinhovden | | |
| 8,469,305 B2 | 6/2013 | Feldstein et al. | | |
| 8,740,127 B2 * | 6/2014 | Soper | ................ | B65H 75/4421 |
| | | | | 242/388.9 |
| 8,896,656 B2 | 11/2014 | Epstein et al. | | |
| 9,475,673 B2 | 10/2016 | Feldstein et al. | | |
| 9,516,772 B2 | 12/2016 | Mangione et al. | | |
| 2006/0273211 A1 * | 12/2006 | Langberg | .............. | B65H 75/368 |
| | | | | 242/388.91 |
| 2008/0156922 A1 * | 7/2008 | Rabinowitz | .......... | B65H 75/368 |
| | | | | 242/372 |
| 2012/0175450 A1 * | 7/2012 | Feldstein | ............. | B65H 75/368 |
| | | | | 242/378 |
| 2012/0175452 A1 * | 7/2012 | Feldstein | ............. | B65H 75/368 |
| | | | | 242/381 |
| 2013/0068870 A1 * | 3/2013 | Feldstein | ................ | B65H 75/30 |
| | | | | 242/381 |
| 2014/0246534 A1 | 9/2014 | Sugiura et al. | | |
| 2014/0346268 A1 * | 11/2014 | Feldstein | ............. | B65H 75/368 |
| | | | | 242/397.5 |
| 2015/0166299 A1 * | 6/2015 | Feldstein | ............. | B65H 75/368 |
| | | | | 242/388.9 |
| 2017/0129355 A1 * | 5/2017 | Fournier | .................. | H02J 7/00 |

* cited by examiner

DAMPENED GRAVITY RETRACTOR

CROSS-REFERENCE TO RELATED APPLICATIONS

This application is a continuation-in-part of U.S. application Ser. No. 15/813,738, filed on Nov. 15, 2017, the entire contents of which are expressly incorporated herein by reference.

BACKGROUND OF THE INVENTION

Technical Field

The present invention relates to a cable retractor. More particularly, the present invention relates to a cable retractor attached to flip-top enclosure recessed in a tabletop surface having modular connectivity modules.

Background Art

Most business and academic environments include one or more conference rooms. These conference rooms may be used for any number of functions, but are typically used for meetings in which participants are seated around a table to discuss matters of interest to the participants. Conference rooms are frequently used for presentations where a presenter, standing at one end of the table and using one or more visual aids, such as a video projector or video display screen mounted on the wall at the opposite end of the table, addresses a number of participants seated around the table. It is also common for participants seated at a conference room table to use the table's work surface to support or rest any electronic devices they have with them, for example, a mobile laptop computer. It is also common for one or more of the participants seated at a conference room table to present information from one of their electronic devices (e.g., a laptop) to one or more available conference room visual aids using a cable.

Tabletop enclosures may include one or more cables to provide a data communication interface to users. Cables can be connected to information sources such as laptops, tablet computers, smartphones, to connect with presentation aids installed within the room, for example, projection devices, graphical displays, and speakers.

The cables may be tensioned so that they retract back into the enclosure when not in use. Cable retractors can be secured directly to a tabletop enclosure. Cable retractors can be hidden under a table work surface and provide access to a cable directly through the interior of a tabletop enclosure.

BRIEF SUMMARY OF THE INVENTION

The present disclosure provides a modular flip-top tabletop enclosure having a gravity-driven cable retractor. The tabletop enclosure includes a self-actuated lid configured to spring open by pivoting up along its rear edge. After the lid has sprung open and is standing vertically upright (i.e., perpendicular to its closed position) it begins to automatically recess, by sliding downwardly in a smooth controlled manner into the tabletop enclosure until it is substantially recessed. In an embodiment, the tabletop enclosure is configured with a sensor to determine if the lid is open. Any number of sensors may be used determine the lid position. This information may be transmitted to and used by a control processor or control system.

In a preferred embodiment, the flip-top enclosure is configured to include at least one retractor module insert in which a cable end plug of a gravity retractor cable of a retractor enclosure retractor is exposed. In this embodiment, a retractor enclosure is secured to the flip top frame locking slots by inserting the retractor enclosure locking tabs into said slots. After said insertion, the tabs interlock and seat behind the frame when the retractor enclosure is pulled downward.

In a preferred embodiment, the retractor enclosure includes an opposing set of enclosure cable pulley guide rails. In an embodiment, a cable pulley slidably rides within two cable pulley guide rails. It is preferable that the cable pulley is weighted with one or more weighted disks secured thereto. One end of a gravity retractor cable is anchored at the top of the retractor enclosure. The gravity retractor cable runs down from the anchored point and wraps down underneath a cable pulley and then back up out of the enclosure. The gravity retractor cable has a cable end plug at its non-anchored end. The other end of the gravity retractor cable is passed up through a slot of a retractor module insert door. In another embodiment, the other end of the gravity retractor cable is passed up through an opening at the bottom of a retractor module insert. The gravity retractor cable is preferably flat in order to ease insertion through the slot of the pass-through a module insert door, however other shapes of cables may be used (e.g., round).

One or more interchangeable modules can be inserted from the top of the housing frame, thereby allowing the tabletop enclosure to be configured for a various number of connectivity and/or power distribution scenarios. In some embodiments, the various module inserts may be configured to provide one or more of, USB charging, A/C power, D/C Power, LAN connection, OneTouch button control, low-voltage power distribution, retractor cable access, pass-through cable access, or the like. In an embodiment, the module inserts are secured into place by one or more module locking bars.

In an embodiment, the flip-top enclosure includes a DC-DC power and signal bus board with multiple bus board module connectors in each module bay. A module insert may include a connector that mates to a corresponding bus board module connector. The power and signal bus board can distribute power and data to any module insert requiring it. In an embodiment, the bus board provides 24-Volt DC power to module inserts and a communication bus for data communication with control system.

In an embodiment, a magnetic bezel is secured using a plurality of magnets disposed thereunder, which secure along top perimeter of the tabletop enclosure frame so that the surface of the magnetic bezel conceals the edges of an opening cut through a tabletop. The magnetic bezel may include a crossbar in order that module inserts may only be installed, removed, or changed when the magnetic bezel is removed from the flip-top tabletop enclosure frame.

In an embodiment, the enclosure houses a control system. The control system may be implemented as a combination of computing devices, such as a combination of a DSP and a microprocessor, a plurality of microprocessors, one or more microprocessors in conjunction with a DSP core, or any other such configuration. The control system may be any controller, microcontroller, or state machine. control system may be implemented with, a Digital Signal Processor (DSP), an Application Specific Integrated Circuit (ASIC), a Field Programmable Gate Array (FPGA) or other programmable logic device, discrete gate or transistor logic, discrete hardware component(s), or any combination thereof.

According to an embodiment, the enclosure includes geolocation beacons. In an embodiment, the enclosure includes backlighting for one or more buttons accessible to users In an embodiment, the enclosure frame is constructed from metal. According to an embodiment, the enclosure includes one or more dog-ears recessed into the frame to initially ease of the frame installation into the tabletop so that when the frame is positioned properly into the table the dog ears will open into their locking position and as they are screw tightened from the top of the enclosure, they will engage the bottom of the table and lock down the frame. According to an embodiment, the enclosure includes two dog-ear fasteners on each of its sides.

According to an embodiment, a retractor enclosure is installed vertically below a retractor module insert. The gravity retractor cable is guided into a retractor enclosure and is passed underneath a cable pulley, therefore causing a retracting bias relative to the combined weight of both the cable pulley and the gravity retractor cable. In one embodiment, the cable pulley has two weighted disks secured to each of its sides.

A loop of cable is formed inside the storage compartment with the pulley resting in the 180-degree curve at the bottom of that loop. In an embodiment, when a length of gravity retractor cable is pulled out and laid flat, it stays in place due to the friction from bending and from the reduction in the vertical length and weight of the remaining gravity retractor cable in the storage compartment retractor enclosure. To retract the gravity retractor cable, the user lifts up the cable end plug of the gravity retractor cable to a nearly vertical orientation (to reduce the friction) and guide it by hand into the retractor enclosure until the shortened length enables the cable to start retracting under its own weight. The cable pulley, due to its weight, moves down while it is rotating and is guided through two profile guide rails that are built into inside surfaces of the retractor enclosure. The gravity retractor cable is wrapped one-half turn around the cable pulley. This approach enables retraction of a length of cable which is twice the distance of the cable pulley's travel which is approximately the length of the retractor enclosure. The retractor enclosure can be fabricated out of formed or extruded metal, molded plastic, extruded plastic, or the like.

According to one embodiment, the retractor enclosure is secured to a flip top frame via one or more retractor enclosure locking tabs are inserted and interlocked within one or more frame locking slots located about said frame.

BRIEF DESCRIPTION OF THE SEVERAL VIEWS OF THE DRAWINGS

The present invention may be better understood and its features made apparent to those skilled in the art by referencing the accompanying drawings.

The use of the same reference symbols in different drawings indicates similar or identical items.

REFERENCE SIGNS LISTING

Figure 1:
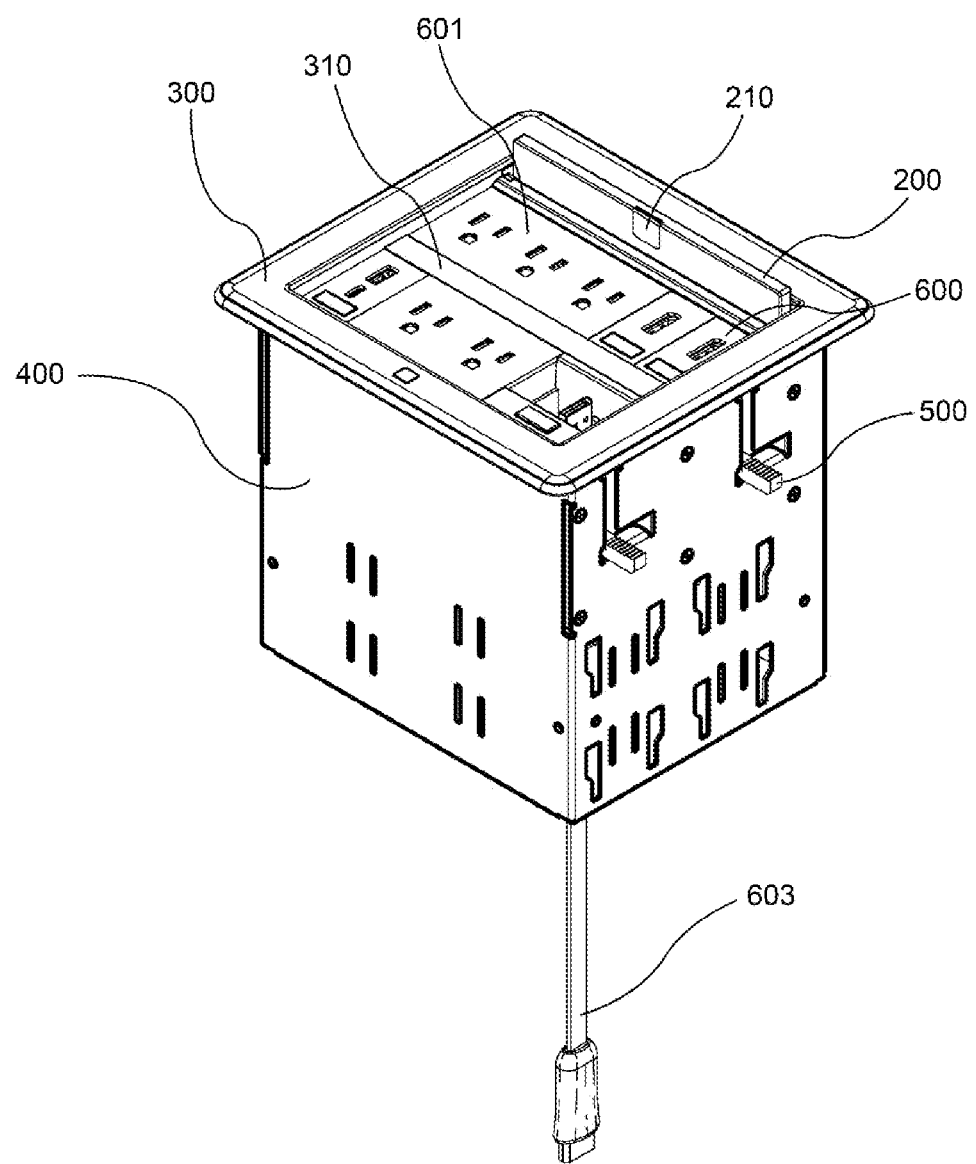
FIG. 1 is a front isometric view of a flip-top in accordance with an embodiment of the invention.

The following is a list of the major elements in the drawings:
100 Bus Board
110 Bus Board Data Connector
120 Bus Board Module Connector
140 Bus Board Cover
200 Lid Assembly
205 Lid
210 Steel Insert
211 Adhesive Pad
212 Steel Insert Recess
220 Lid Carrier
230 Torsion Spring
240 Linear Guide Carriage
250 Rotary Dampener
260 Hinge Pin
300 Magnetic Bezel
310 Bezel Crossbar
400 Frame
450 Housing Back
500 Dog Ears
600 Video Module Insert
601 Power Module Insert 3-Gang
603 Gravity Retractor Cable
604 Female NEMA Connector
605 Retractor Module Insert
606 Video Cable Connector
607 Retractor Enclosure Locking Tabs
608 Frame Locking Slots
609 AC Power Cables
610 Retractor Enclosure
611 Retractor Enclosure Cover
612 Cable Pulley
613 Weighted Disk
614 Enclosure Cable Pulley Guide Rail
615 Retractor Module Insert Door
616 Cable End Plug
617 Pulley Rotational Dampener
618 Pulley Rotational Dampener Guide Block
619 Cable Pulley with Teeth
650 USB Charger Module
651 USB A Cable Connector
652 USB A Cable Connector
700 Module Guides
701 Module Locking Bars
750 Module Rails
751 Module Rail Grove
800 Door Guide Block
850 Profile Guide Rail
860 Rack Gear
900 Lid Release Button
910 Lid Release Button Assembly
920 Lid Release Button Assembly Magnet
1000 Exploded Frame Modules
2000 Exploded Lid Assembly 3000 Exploded Housing Back
4000 Exploded Button Assembly
5000 Exploded Bus Bar Assembly

DETAILED DESCRIPTION OF THE INVENTION

FIG. 1 shows a flip-top enclosure according to one or more embodiments of the present invention. As can be seen, flip-top enclosure has a frame 400. When installed into a cutout opening of a table, frame 400 sits recessed below the table surface. Magnetic bezel 300 sits flush above the tabletop surface. As shown in FIG. 1, self-deploying dog-ears 500 can be used to secure the flip-top enclosure into an opening of the tabletop by deploying outwardly underneath the tabletop work surface. Magnetic bezel 300 includes a crossbar 310. The shown flip-top enclosure has a lid assembly 200 that includes a steel insert 210. As can be seen, gravity retractor module cable 603 exits the bottom of enclosure frame 400.

As can been seen in FIG. 1, the shown flip-top enclosure has six module inserts installed therein. As described more in detail below, module inserts are interchangeable with various module inserts of a different type and/or gang-size. Some of the module inserts used in FIG. 1 include a 3-gang power module insert 601, and a video module insert 600. The module configuration shown in FIG. 1 is only exemplary, and the types, sizes (gang-size), or locations of the module inserts used within the flip-top enclosure is not limited to the configuration shown.

Figure 2:
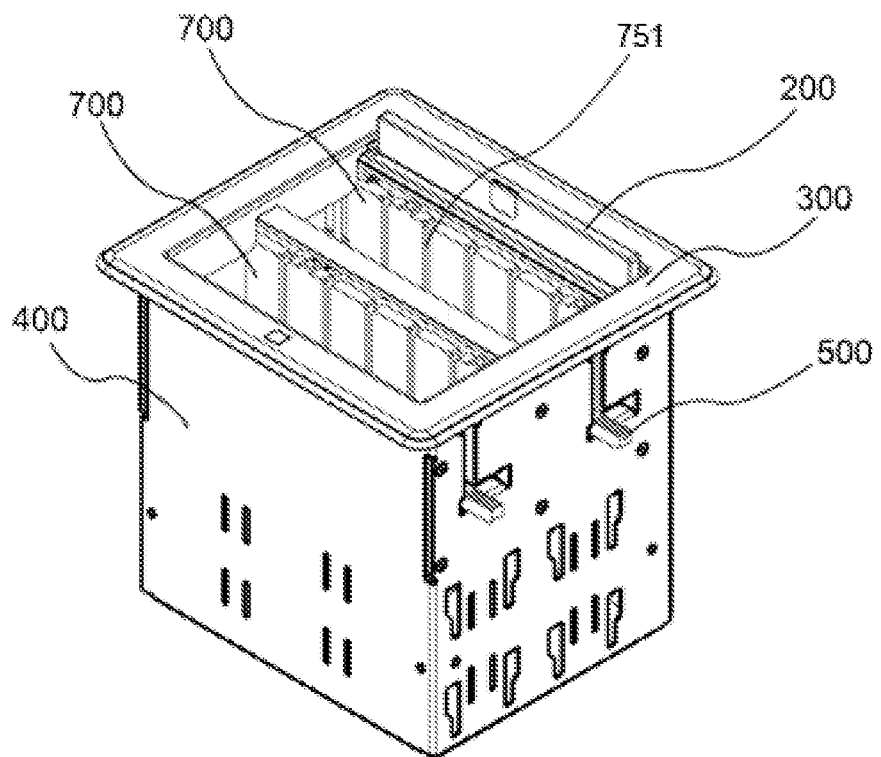
FIG. 2 is a front isometric view of the flip-top in FIG. 1 without any module inserts, in accordance with an embodiment of the invention.

FIG. 2 shows an embodiment of the flip-top enclosure without any modules inserts installed therein. As can be better seen in this view, a plurality of mutually opposing module guides 700 are arranged to receive one or more module inserts. Opposing sides of the module guides 700 provide a plurality of module rail grooves 751 to help align module insert interspacing and ensure proper orientation of any module inserts inserted into the flip-top enclosure. Module rail grooves 751 may be distributed to help adjust module insert interspacing.

In an embodiment, the proper orientation of any module inserts to be inserted can be guaranteed by alternating the width of forward facing module rail grooves 751. For example, forward facing module rail grooves 751 can be made wider than rearward facing rail grooves 751. In a like manner, rearward facing module rails can be made wider than the forward facing module rails make. Therefore, a module insert orientated backwards could not be inserted in to the module guides 700 because the wider module rail would be too wide to slide into the narrow module rail groove 751.

Figure 3:
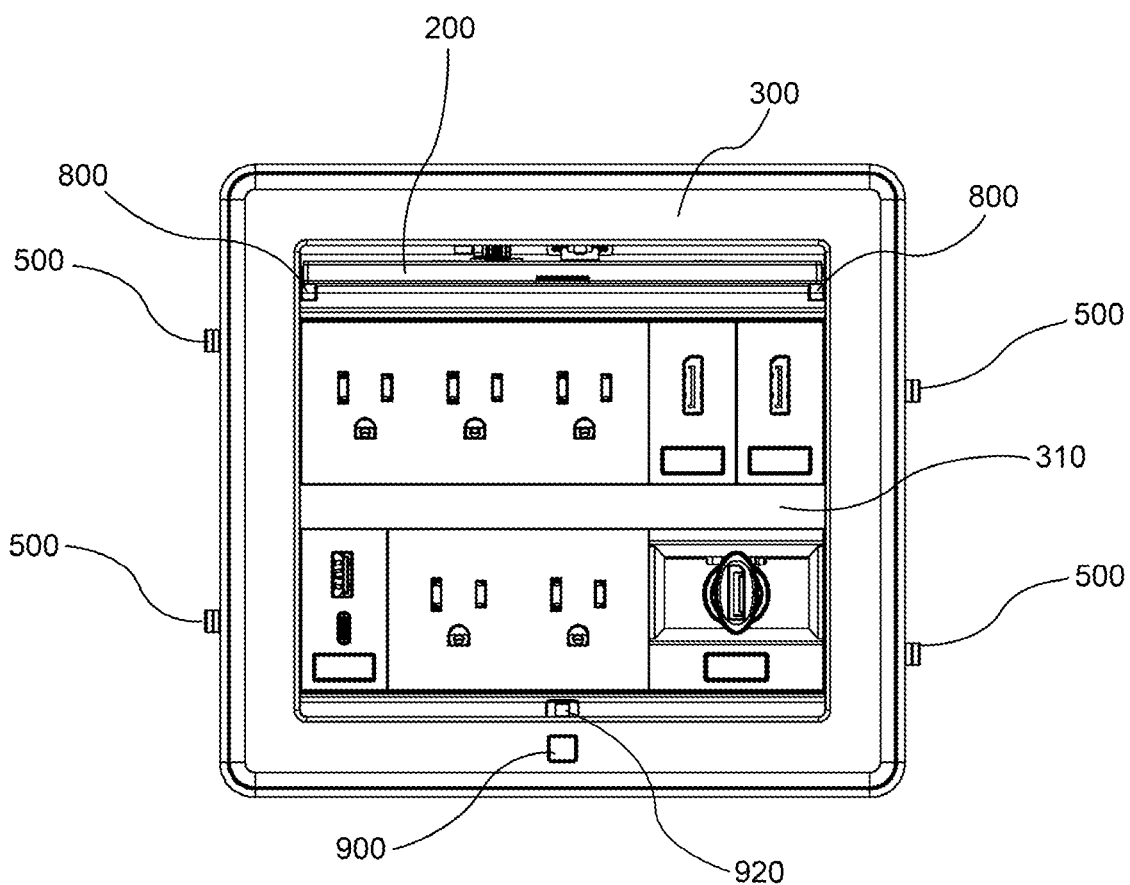
FIG. 3 is a top view of the flip-top in FIG. 1 in accordance with an embodiment of the invention.

FIG. 3 shows a top view of the flip-top in FIG. 1. Taken from this view, it can be seen that lid release button assembly magnet 920 is exposed from the inside ledge of magnetic bezel 300. When the lid is in the closed position (closed lid position shown in other views), the lid release button assembly magnet 920 magnetically holds the lid in the closed position. When the lid release button 900 is depressed, it causes the lid release button assembly magnet 920 to swing away from the lid allowing the lid to escape the magnetic pull of the lid release button assembly magnet 920.

FIGS. 4-8 show embodiments of interchangeable module inserts that may be mounted within the tabletop enclosure in one or more embodiments of the invention. In all embodiments, it is preferable that the interchangeable module inserts have one or more set of opposing module rails 750 disposed along their front and back for slidably engaging a corresponding number of module rail grooves 751 (shown in FIG. 2) of the opposing module guides 700 (shown in FIG. 2) of the flip-top enclosure.

Figure 4:
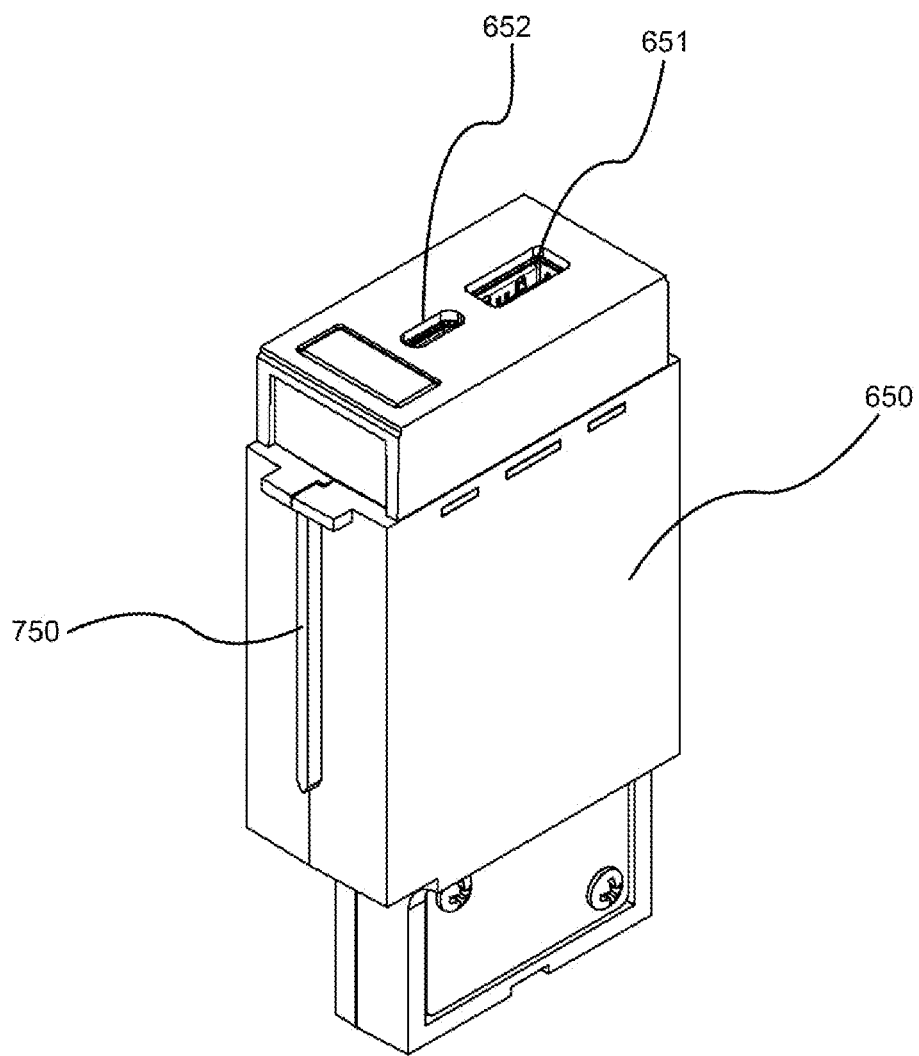
FIG. 4 is a front isometric view of a USB charging module insert in accordance with one embodiment of the invention.

Now turning to FIG. 4, in some embodiments a module insert can be 1-gang sized USB charger module 650 that provides power to an external device via an universal serial bus ("USB") C (type-C) cable connector 652 or an USB a (type-A) cable connector 651. In an embodiment, the flip-top enclosure provides an interface for connecting an information source to a presentation device. Connections may also be made to other interconnected devices, for example, a conference room head-end connected to a presentation device. Presentation devices include but are not limited to display equipment, screen projectors, large flat screens, audio speakers, and the like. In some embodiments, a cable is used in order to connect to a module insert installed within the flip-top enclosure.

In some embodiments, module inserts only pass power to the devices connected to it. An example use would be to recharge a battery-powered device, like a cell phone. Some module inserts act as a data interface. In an embodiment, for example, data from a connected information source can directly delivered to a head-end for a presentation device. In another embodiment, data from a connected information source is digitally encoded by audio/video encoders into data packets suitable for transmission via a connected LAN (local area network) by encoding their output into network-compatible digital format and transmitting such information via the local area network. Encoded video signals may be recovered from the network signals by a video decoder before being presented to a presentation device. A presentation device can be located in the same or any number of rooms local or remotely located.

Figure 5:
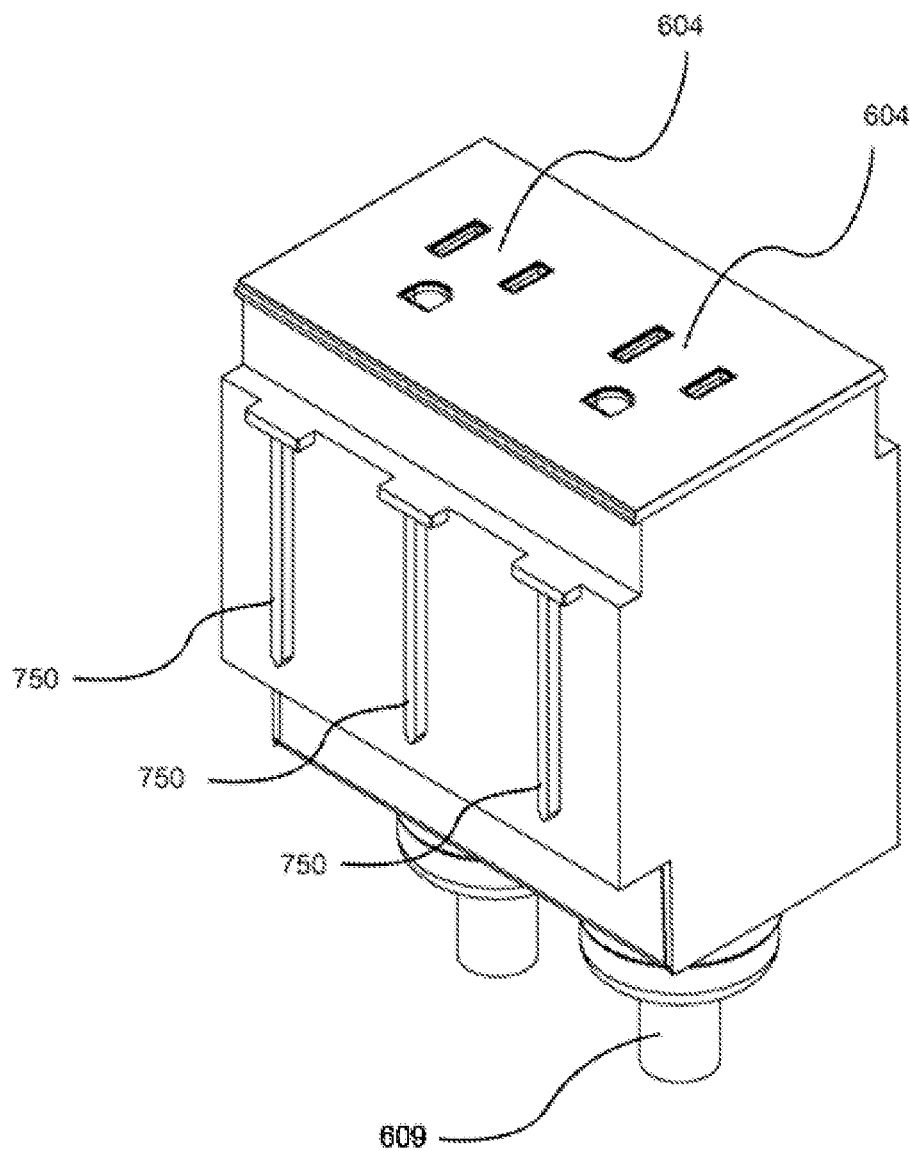
FIG. 5 is a front isometric view of a 2-gang power module in accordance with an embodiment of the invention.

Referring now to FIG. 5, in some embodiments a module insert can be 2-gang sized power module having a one or more female NEMA connectors 604. Additional module rails 750 can be provided in embodiments using 2-gang sized module inserts. In some embodiments a module, inserts may include one or more AC power cables 609 to provide, for example, mains power.

Figure 6:
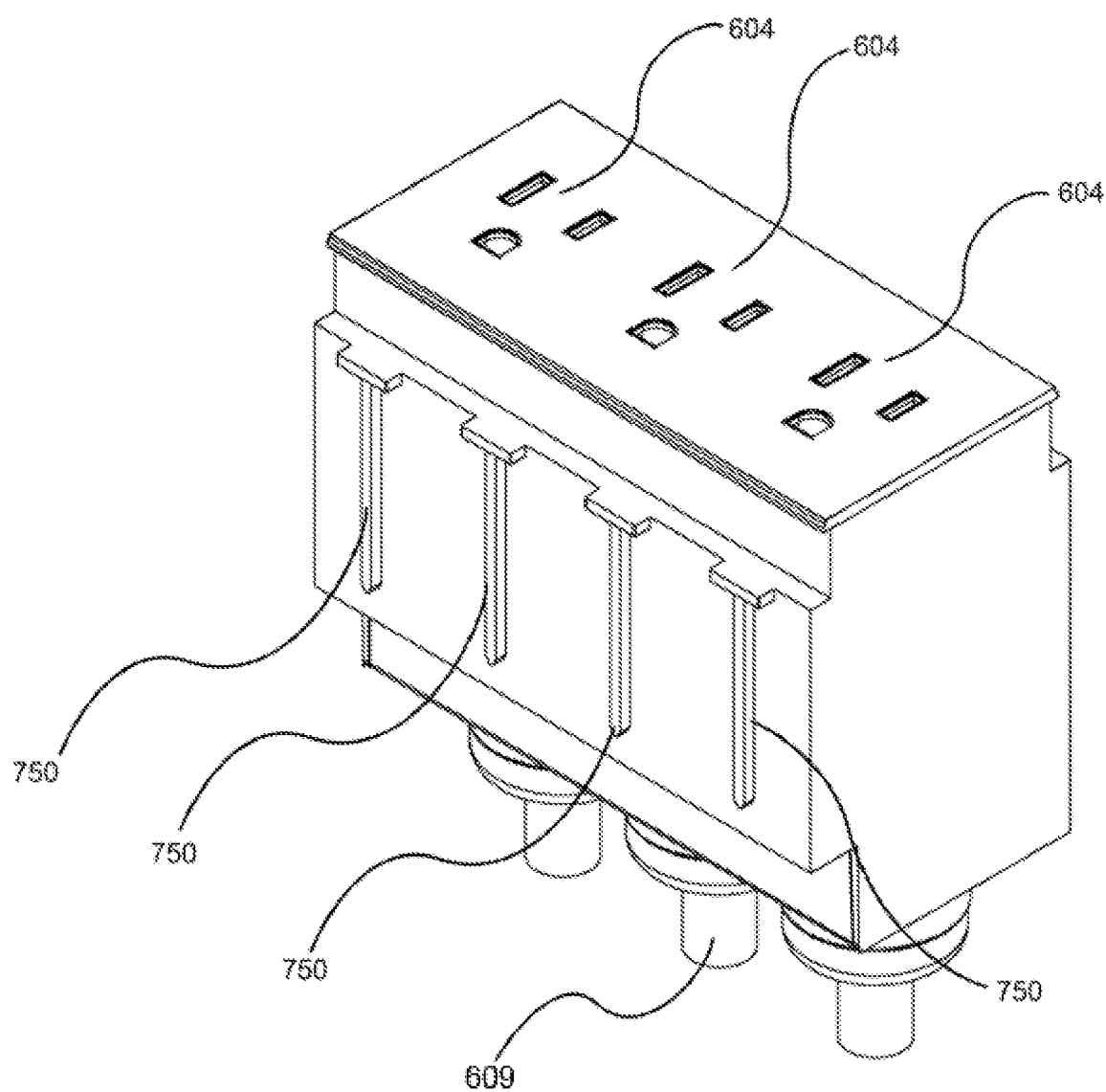
FIG. 6 is a front isometric view of a 3-gang power module in accordance with an embodiment of the invention.
Figure 7:
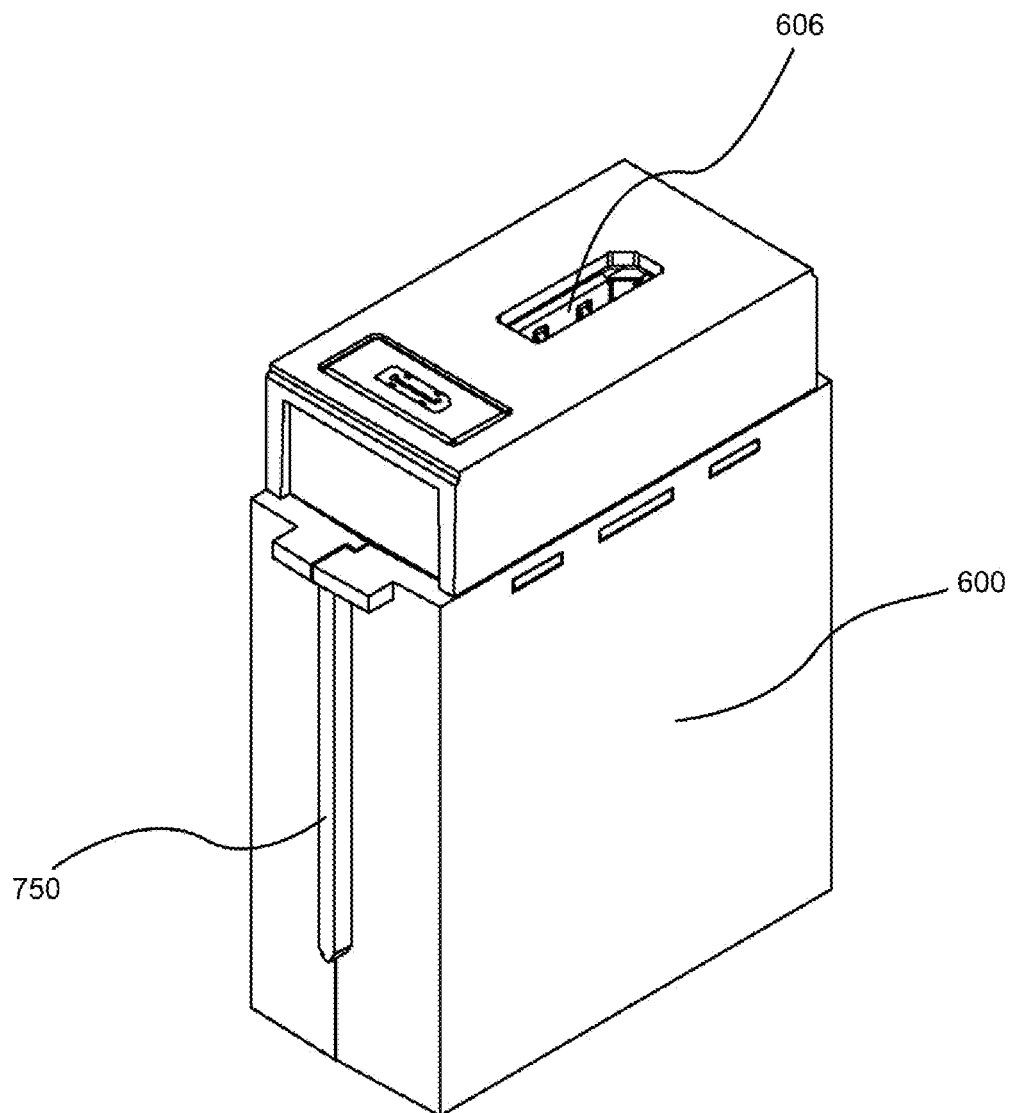
FIG. 7 is a front isometric view of a video module in accordance with some embodiments of the invention.
Figure 8:
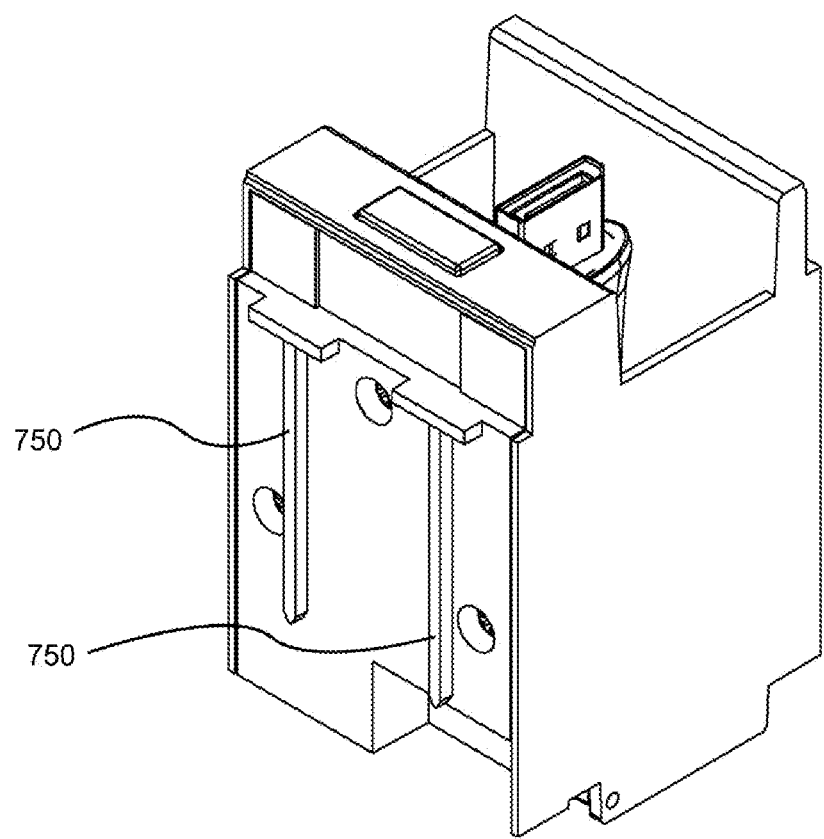
FIG. 8 is a front isometric view of a video retractor module in accordance with some embodiments of the invention.

Referring now to FIG. 6, in some embodiments a module insert is 3-gang sized. In these embodiments, additional module rails 750 are provided to correspond with the larger gang size. In these embodiments, additional female NEMA connectors 604 and/or AC power cables 609 may be provided. Now turning to FIG. 7, in some embodiments a module insert can be 1-gang size video module insert 600 having one or more a video cable connectors 606. In some embodiments, module inserts may be a gravity retractor module with a cable passed through the module insert as shown in FIG. 8.

Figure 9:
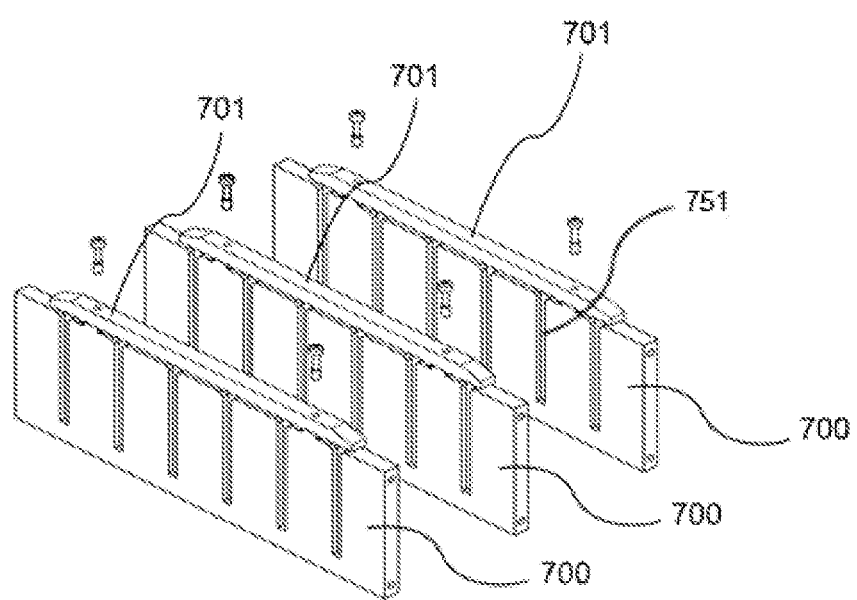
FIG. 9 is a front isometric view of the module guides and module locking bars of the flip-top in FIG. 1 according to an embodiment of the invention.

FIG. 9 shows three module guides 700 having a plurality of module rail grooves 751. Module locking bars 701 can be used to secure all installed module inserts after they have been slid in to module rail grooves 751.

Figure 10:
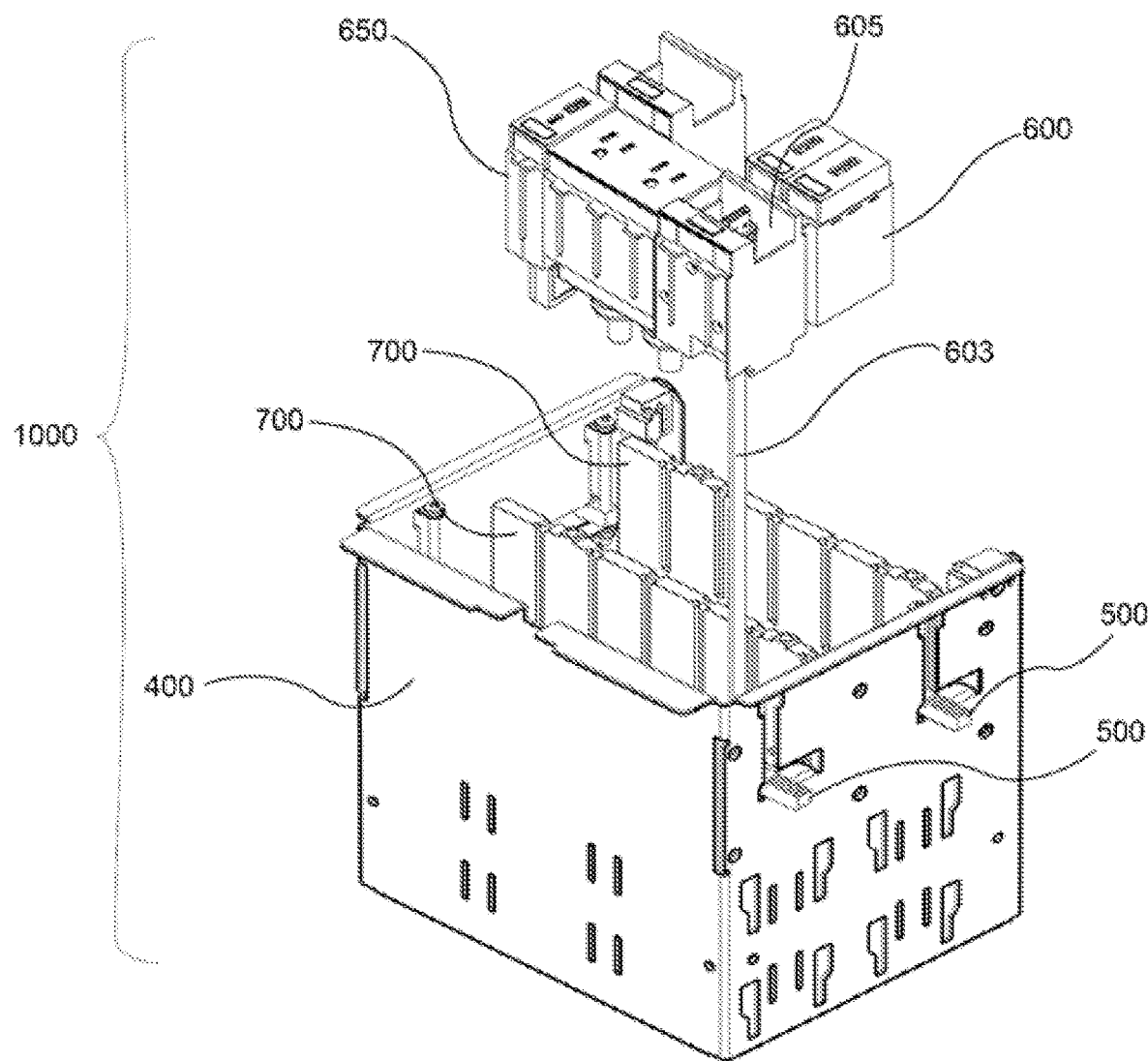
FIG. 10 is an exploded front isometric view of the flip-top in FIG. 1 showing one or more of the modules shown in FIGS. 4-8, in accordance with an embodiment of the invention.
Figure 11:
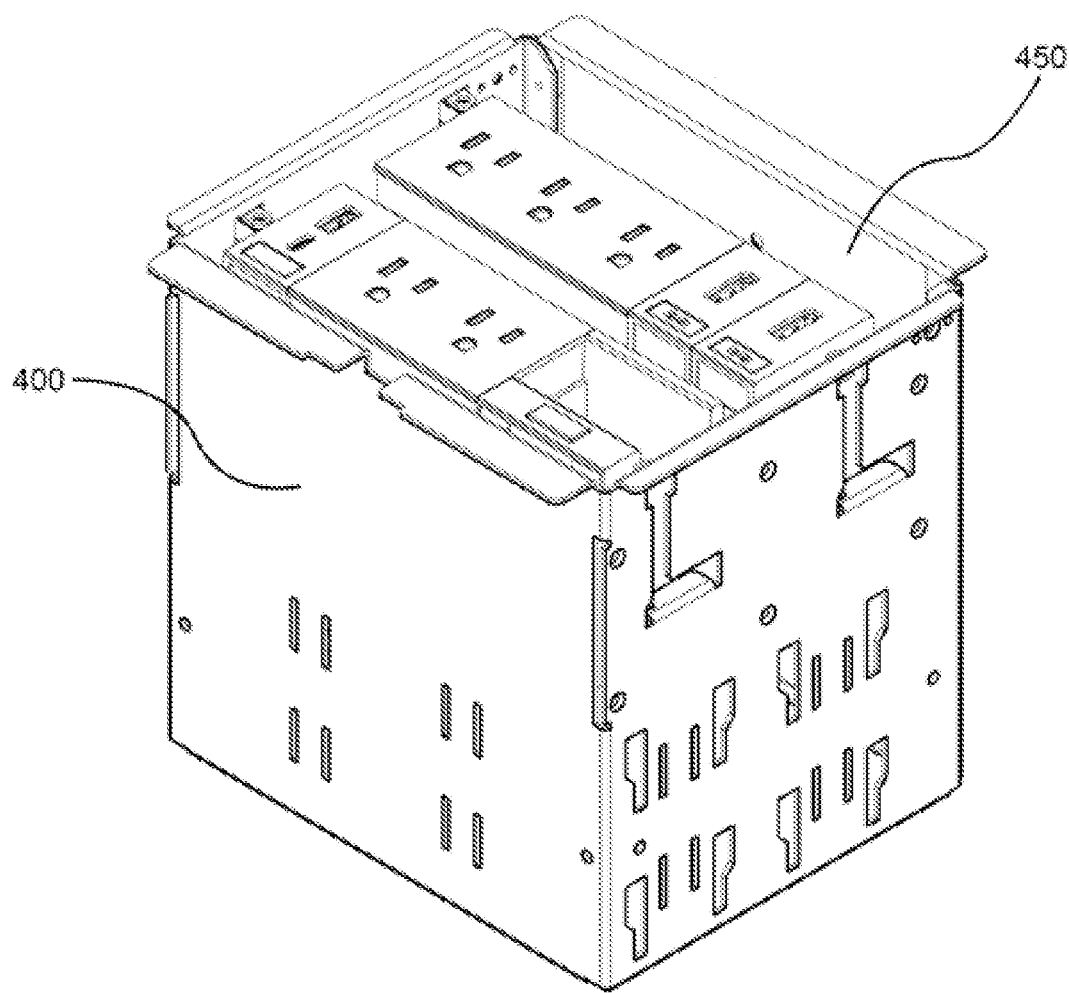
FIG. 11 is a front isometric view of one or more modules like those shown in FIGS. 4-8, inserted within the flip-top in FIG. 1, in accordance with an embodiment of the invention.

FIG. 10 shows an exploded view 1000 of a flip-top enclosure. As can be seen, cable 603 passes through gravity retractor module 605. FIG. 11 shows a flip-top enclosure with several components removed in order to show the housing back 450.

Figure 12:
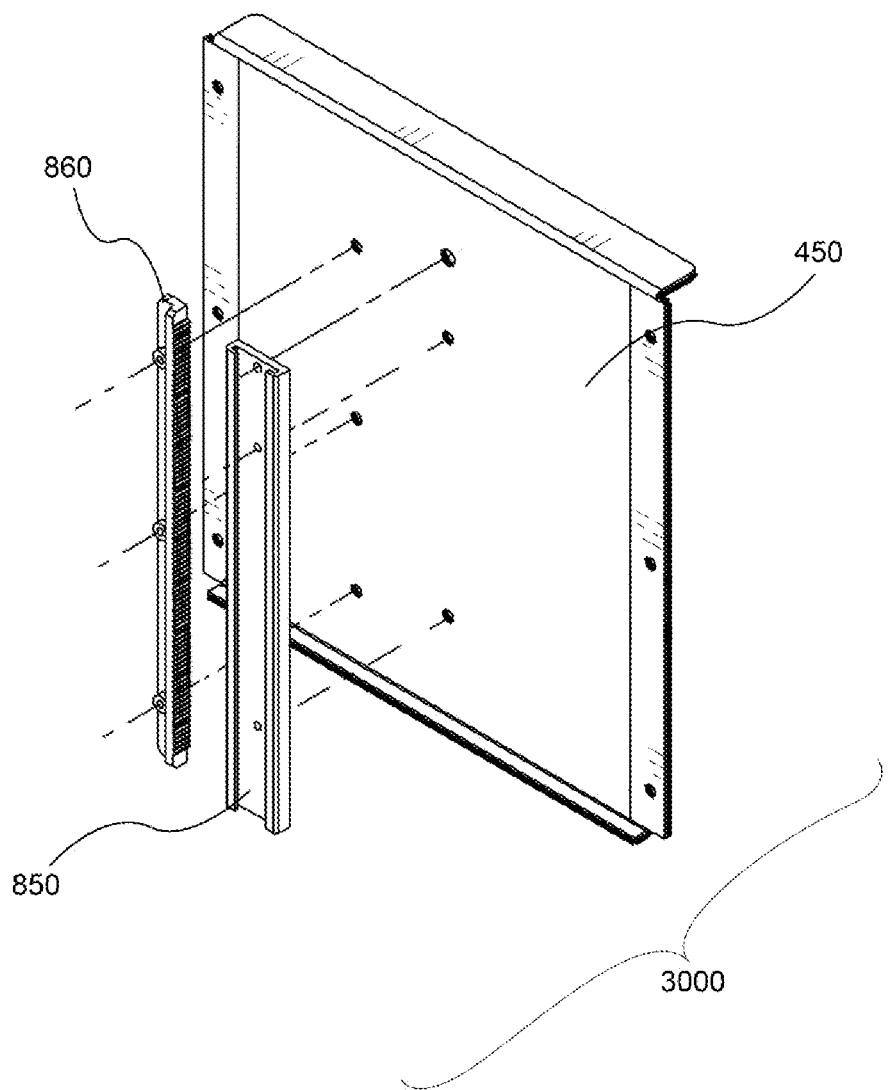
FIG. 12 is an exploded isometric view of the housing back of the flip-top in FIG. 1 showing a profile guide rail and rack gear in accordance with an embodiment of the invention.

FIG. 12 shows an exploded housing back 3000 of a flip-top enclosure according to the one or more embodiments. In these embodiments, a rack gear 860 and profile guide rail 850 are secured to housing back 450.

Figure 13:
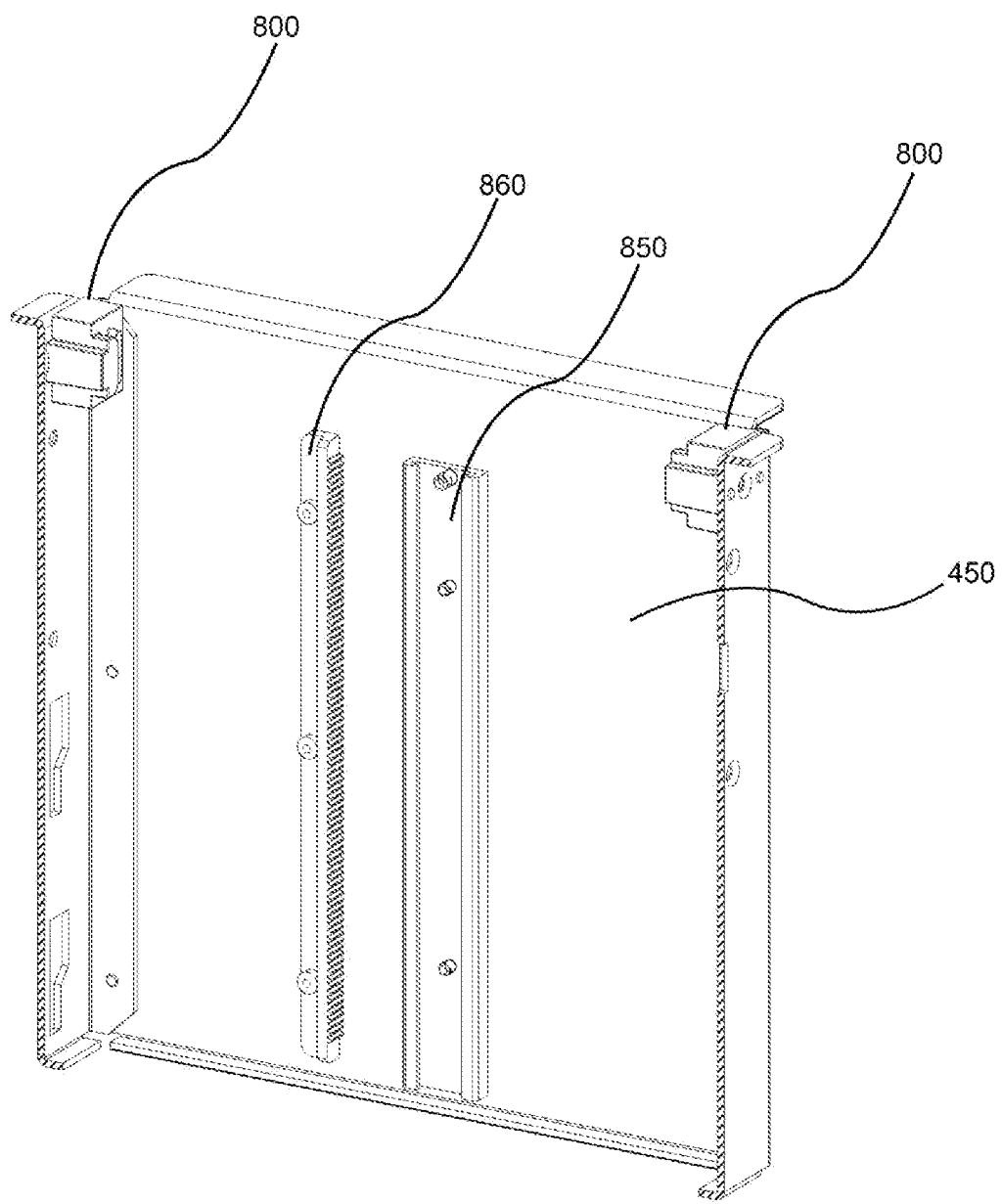
FIG. 13 is a front isometric sectional view of the housing back of the flip-top in FIG. 1 showing the profile guide rail, rack gear, of FIG. 12, and the position of the door guide blocks of the flip-top in FIG. 1, in accordance with an embodiment of the invention.

FIG. 13 shows rack gear 860 and profile guide rail 850 assembled to housing back 450. A door guide block 800 sits adjacent to topmost inside of housing back 450.

Figure 14:
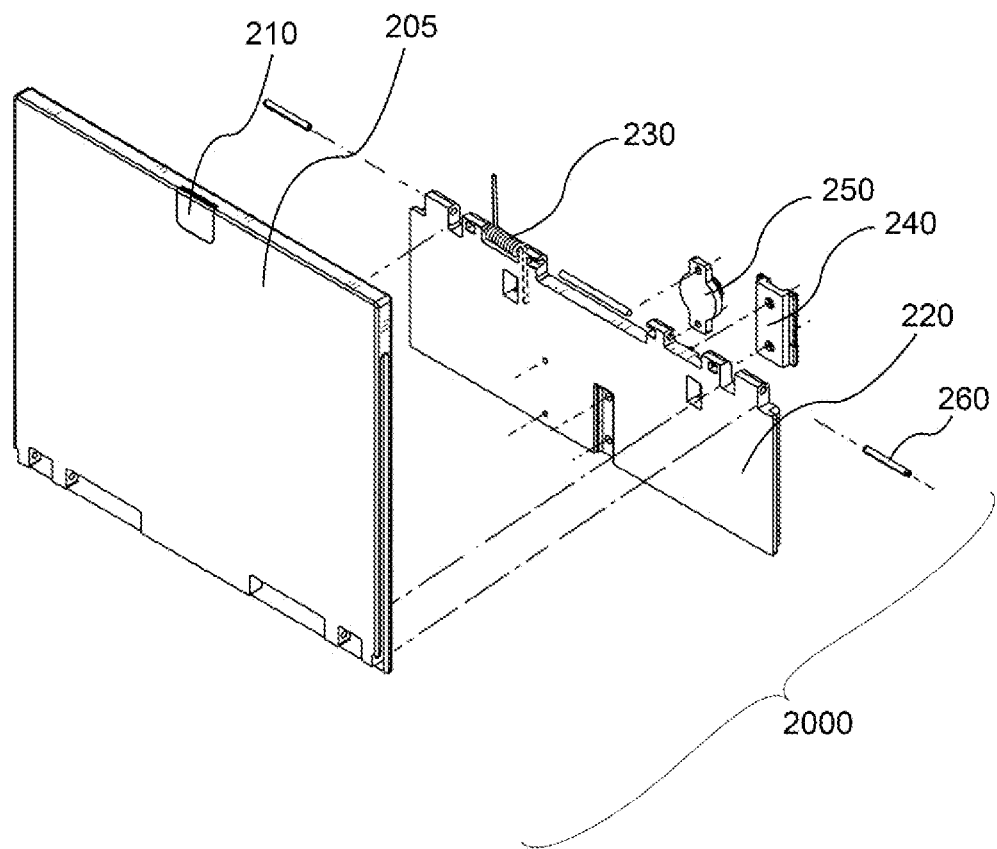
FIG. 14 is an exploded isometric view of the lid assembly of the flip-top in FIG. 1, in accordance with an embodiment of the invention.
Figure 15:
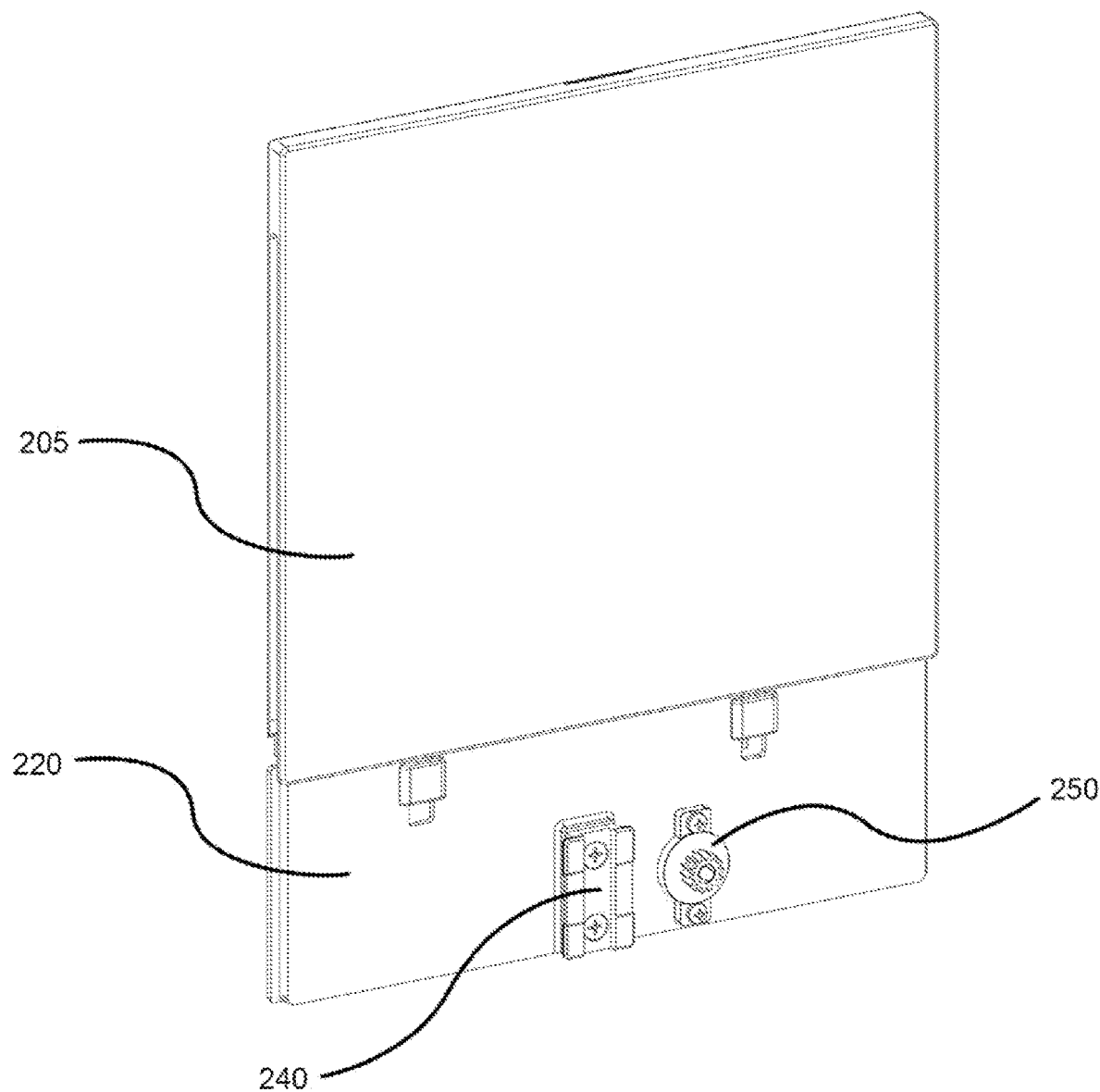
FIG. 15 is a rear isometric view of the lid assembly of the flip-top in FIG. 1, in accordance with an embodiment of the invention.

FIG. 14 shows an exploded view of an embodiment of the lid assembly shown in FIG. 15. Lid 205 is pivotally connected to lid carrier 220 using one or more hinge pins 260. Lid 205 includes steel insert 210 so that it touches lid release button assembly magnet 920 (shown in FIGS. 27-29) when lid 205 is in the closed position. The lid 205 is biased upwardly by a torsion spring 230. Rotary Dampener 250 provides the dampening forces to permit the entire lid assembly to recess at a smooth rate of decent into the flip-top enclosure and linear guide carriage 240 provides linear guidance for the lid assembly decent during the recess. FIG. 15 shows a rear view of the assembled lid assembly shown in FIG. 14.

Figure 16:
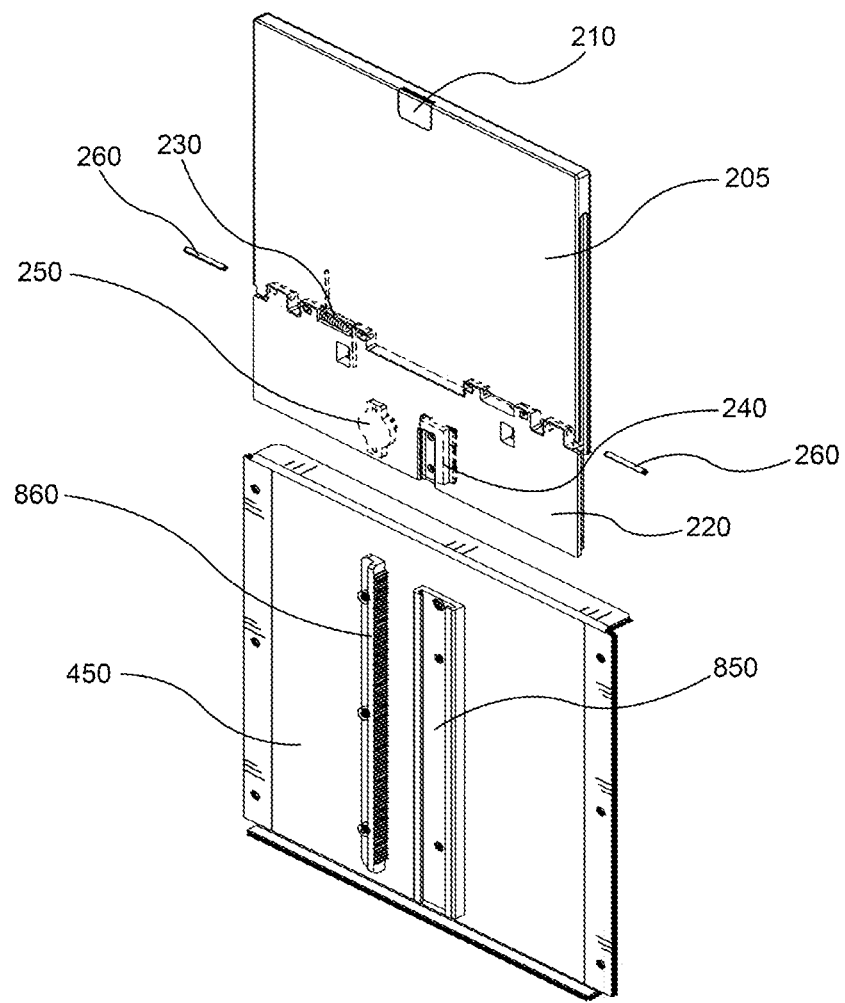
FIG. 16 is an exploded isometric view of the housing back and lid assembly of the flip-top in FIG. 1, in accordance with an embodiment of the invention.

FIG. 16 shows an exploded view of the housing back and lid assembly. Referring to FIG. 16, note that when both the housing back and lid assembly are assembled together, the rack gear 860 and rotary Dampener 250 interface, and mesh. Likewise, linear guide carriage 240 slides up and down within profile guide rail 850 (FIGS. 18 and 19 show this in detail).

Figure 17:
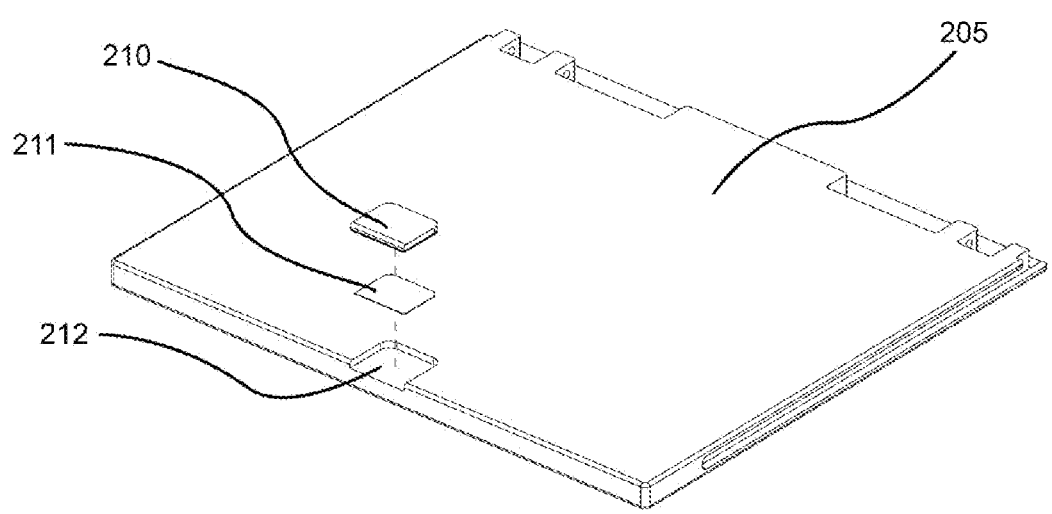
FIG. 17 is an exploded isometric view of the steel insert, adhesive pad, and steel insert recess of the lid of the flip-top in FIG. 1, in accordance with an embodiment of the invention.

FIG. 17 shows an exploded view of one or more embodiments of a flip-top lid utilizing a steel insert. In these embodiments, an adhesive pad 211 may be used to secure steel insert 210 within a steel insert recess 212 of lid 205.

Figure 18:
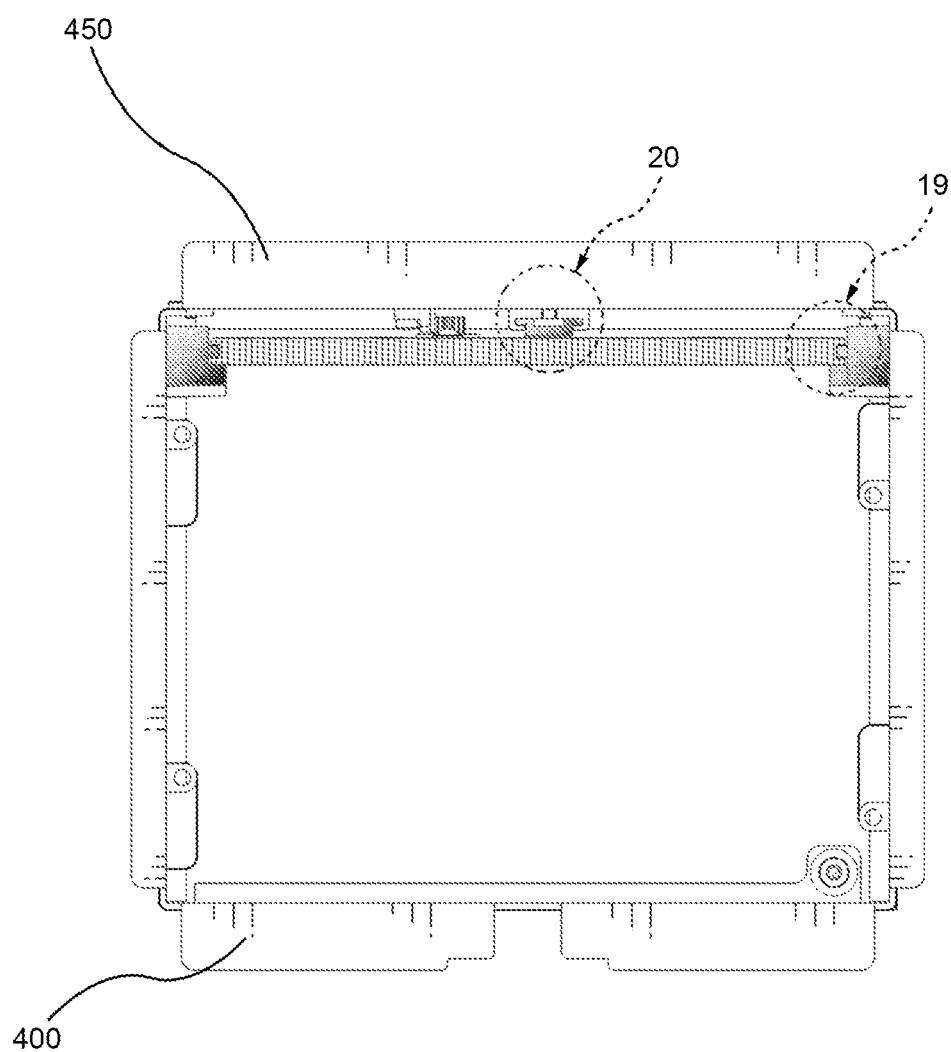
FIG. 18 is a top view of the flip-top in FIG. 1, in accordance with an embodiment of the invention.
Figure 19:
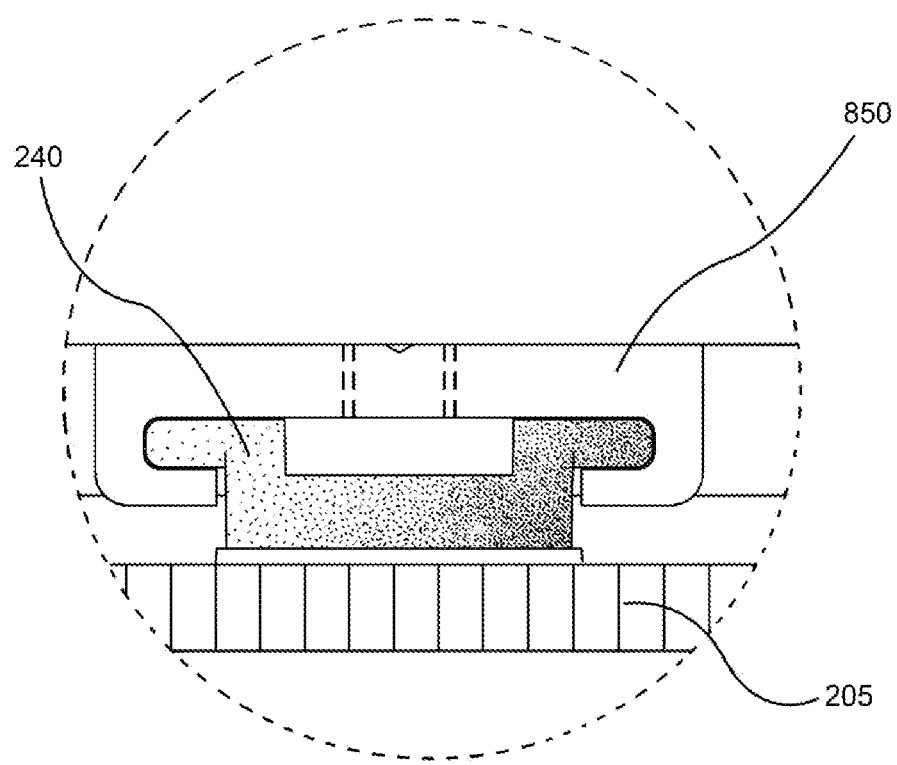
FIG. 19 is a portion of a top view of the flip-top in FIG. 18 enlarged for magnification purposes.
Figure 20:
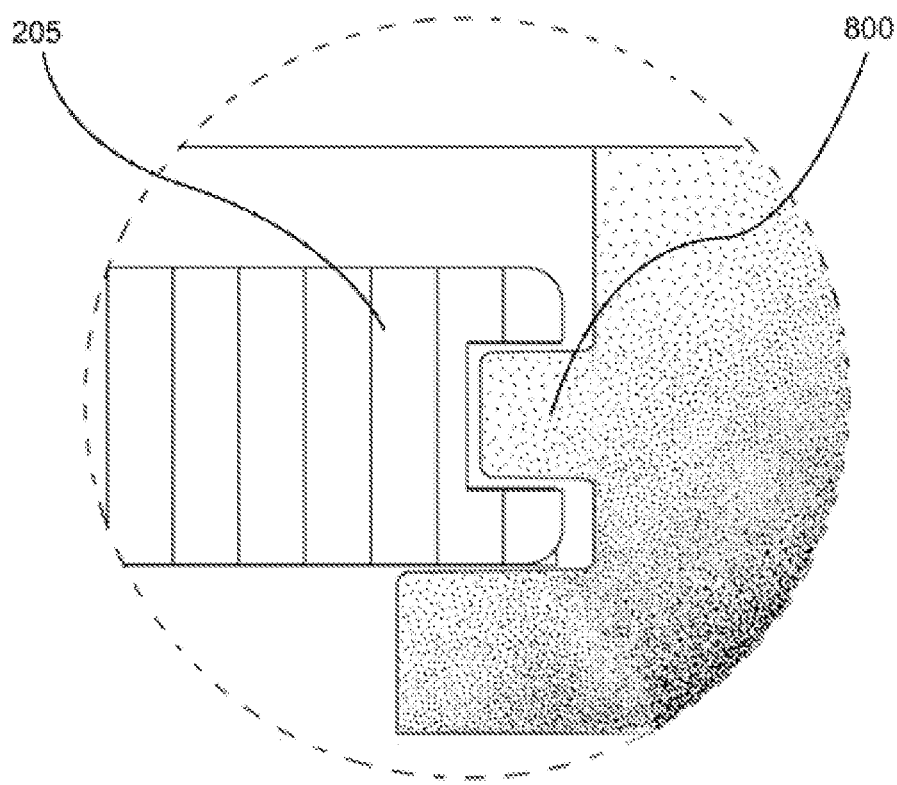
FIG. 20 is a portion of a top view of the flip-top in FIG. 18 enlarged for magnification purposes.

FIG. 18 is a top view of the flip-top in FIG. 1 showing frame 400 and housing back 450. FIG. 19 is an enlarged portion in FIG. 18, showing linear guide carriage 240 of lid 205 inserted within profile guide rail 850. FIG. 20 is an enlarged portion of FIG. 18, showing the sides of lid 205 slidably engaging one of the door guide blocks 800.

Figure 21:
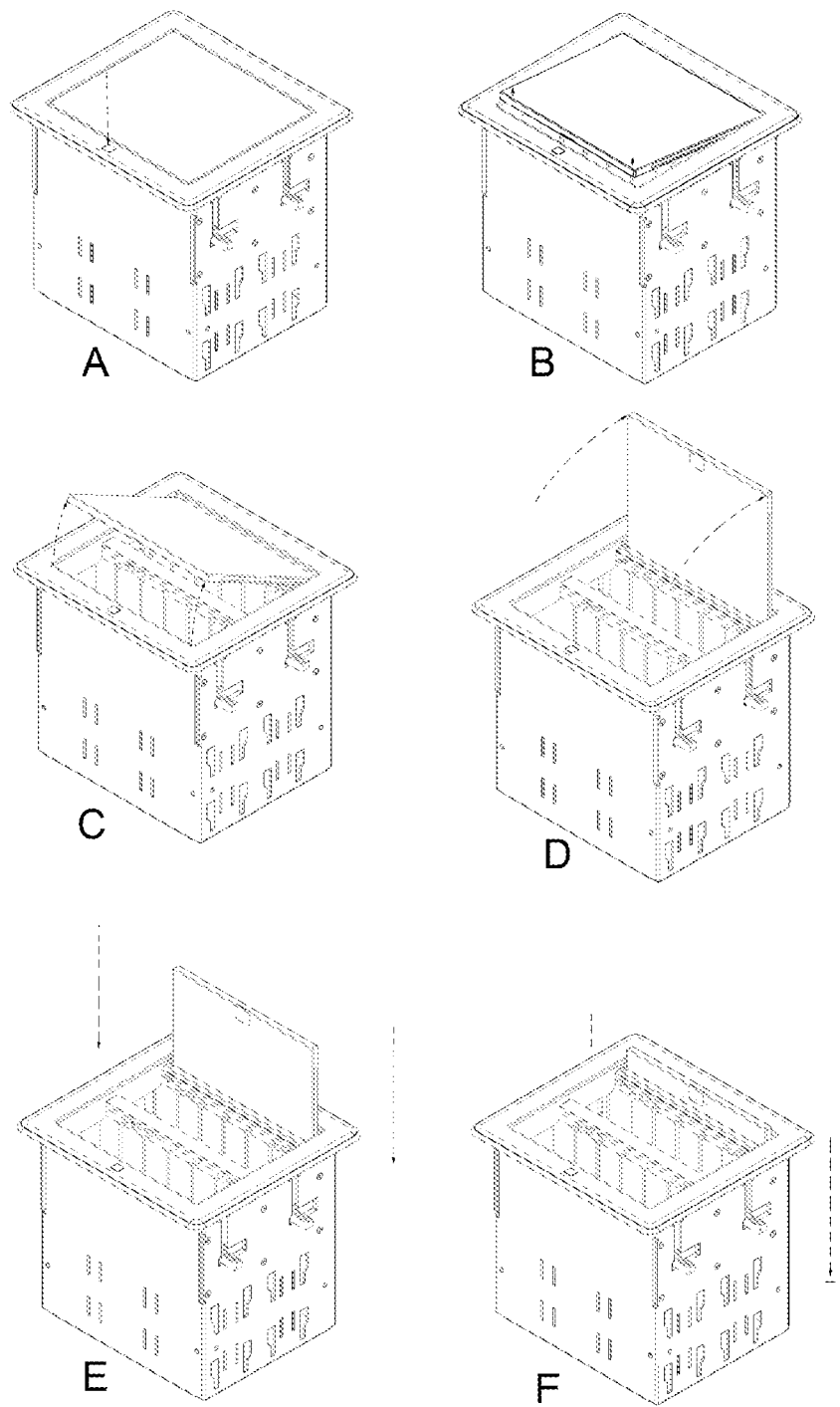
FIG. 21 is a series of front isometric views showing the flip-top lid in FIG. 2 springing upwardly to a vertical position and then afterwards recessing by dropping down into the flip-top frame, in accordance with an embodiment of the invention

FIG. 21 shows intermediate positions of the self-actuated lid springing open as it pivots up along its rear edge. After a user presses the lid release button, the lid begins to automatically spring open (e.g., A, B, and C). The only interaction needed by a user to start lid opening sequence, is the pressing of the lid release button. The lid is biased upwardly by a hinge-pin retained torsion spring. The lid release button permits the release of the lid release button assembly magnet and thereby permits the torsion spring to springably act upon the lid and cause it to pivot upward about its hinge. After the lid has sprung open and is standing vertically upright (e.g., D) the gravitational forces direct the lid assembly and cause it to recess by sliding downwardly into the tabletop enclosure (e.g., E) until it is substantially recessed (e.g., F).

Figure 22:
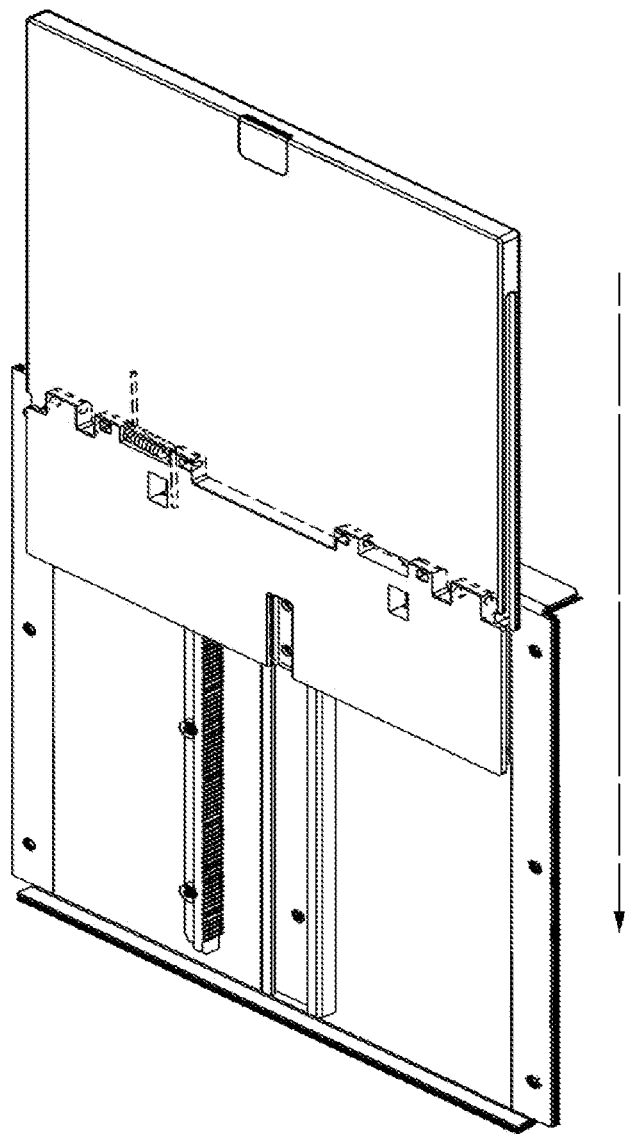
FIG. 22 is a front partial isometric view showing the flip-top lid assembly recessing along the profile rail while engaging the rack gear, in accordance with an embodiment.
Figure 23:
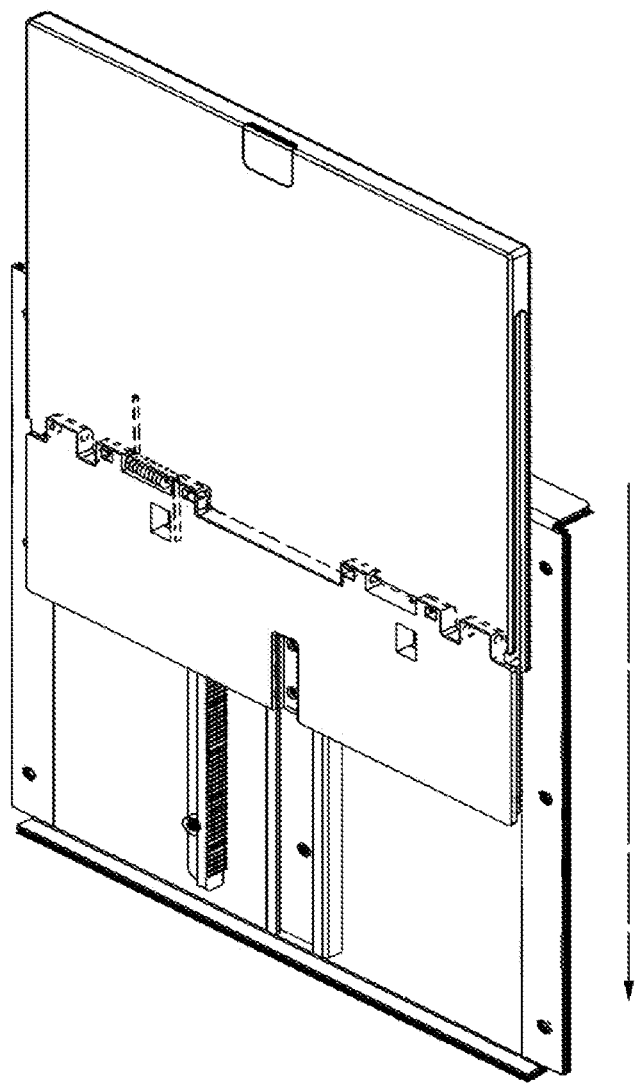
FIG. 23 is a front isometric view showing the flip-top lid assembly in FIG. 22 continuing to recess along the profile rail while engaging the rack gear, in accordance with an embodiment.
Figure 24:
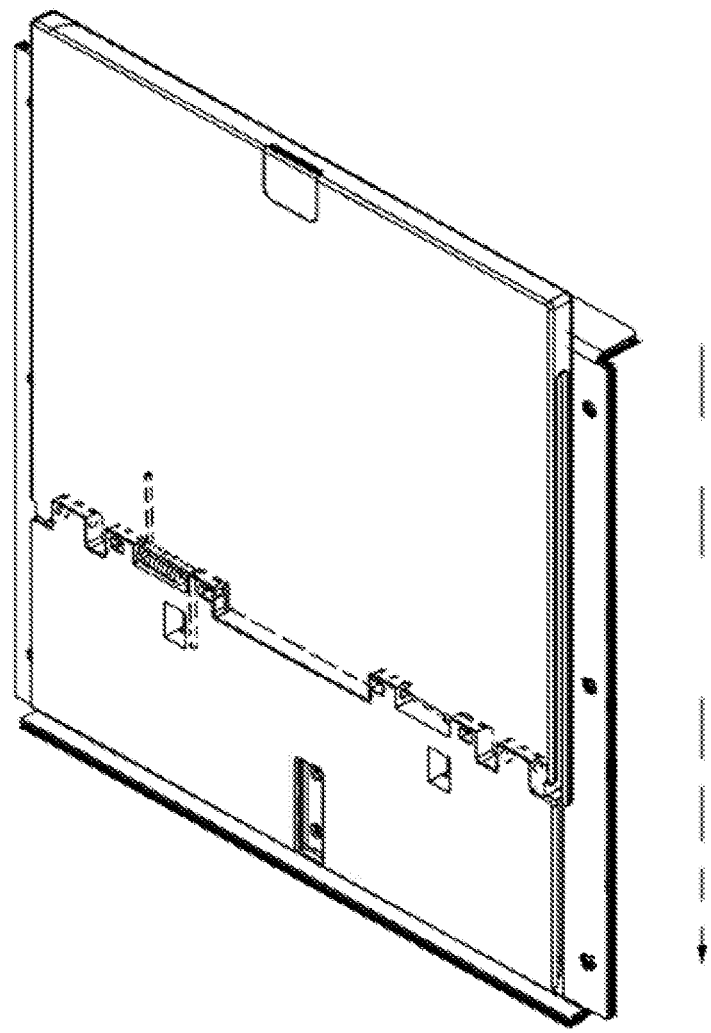
FIG. 24 is a front isometric view showing the flip-top lid assembly in FIG. 23 after it has fully recessed, in accordance with an embodiment.

FIGS. 22-24 show a front partial view of the flip-top lid assembly recessing along the profile rail while engaging the rack gear of the housing back. Gravitational forces begin the recessing procedure subsequent to the lid having completed its spring upward to the open position.

Figure 25:
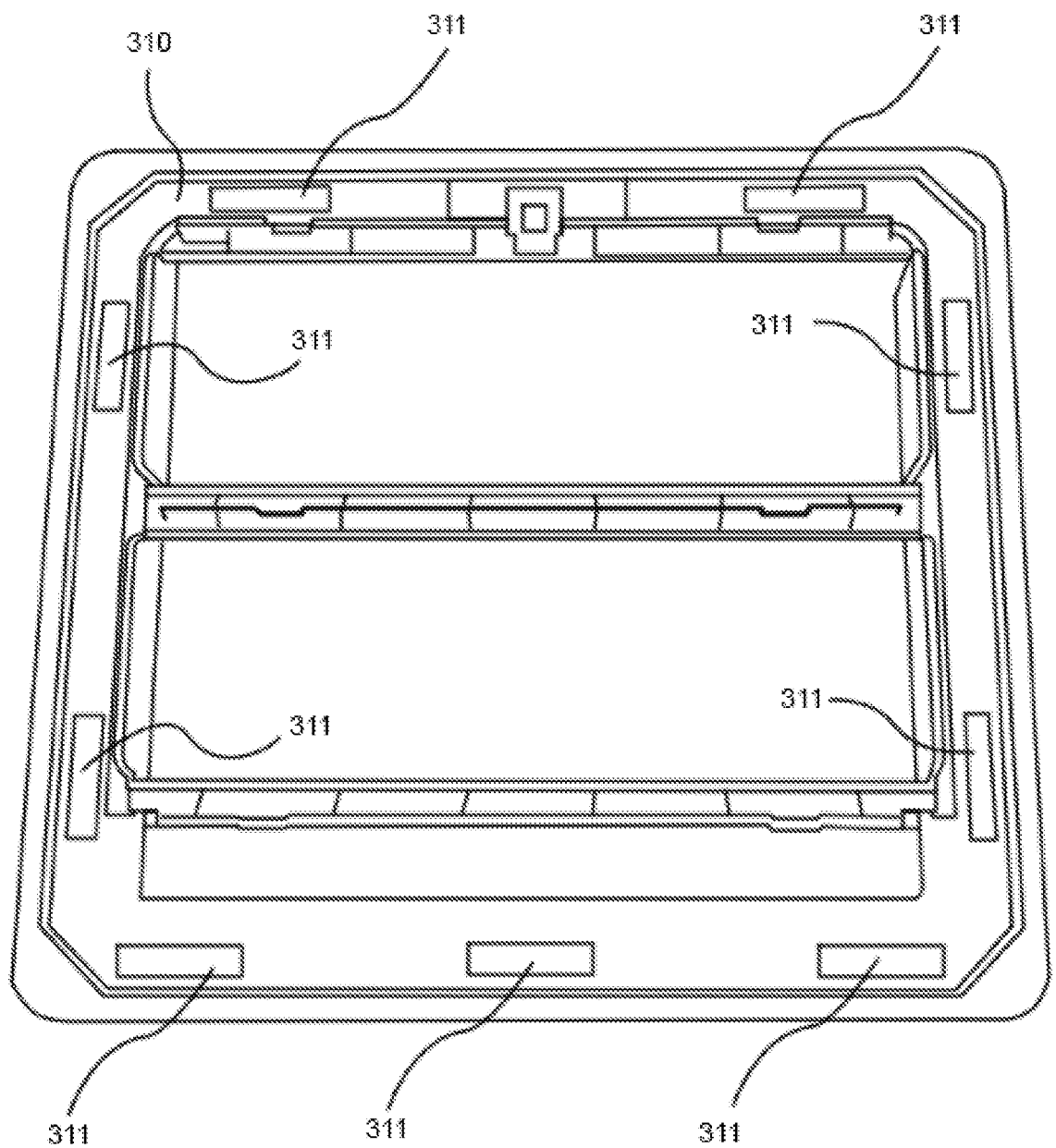
FIG. 25 is a bottom perspective view of the magnetic bezel of the flip-top enclosure, in accordance with an embodiment of the invention.

FIG. 25 shows the bottom of magnetic bezel 300. In an embodiment, magnetic bezel 300 has a plurality of magnets 311 disposed thereunder to magnetically secure to the top perimeter of the tabletop enclosure frame. The magnets can be selected from any appropriate magnet types including, neodymium iron boron (NdFeB), samarium cobalt (SmCo), alnico, ceramic, or ferrite. The top perimeter of the tabletop enclosure frame can be constructed from a ferromagnetic metal. Examples include iron, nickel, cobalt, gadolinium, dysprosium, or alloys that contain ferromagnetic metals, such as steel.

Figure 26:
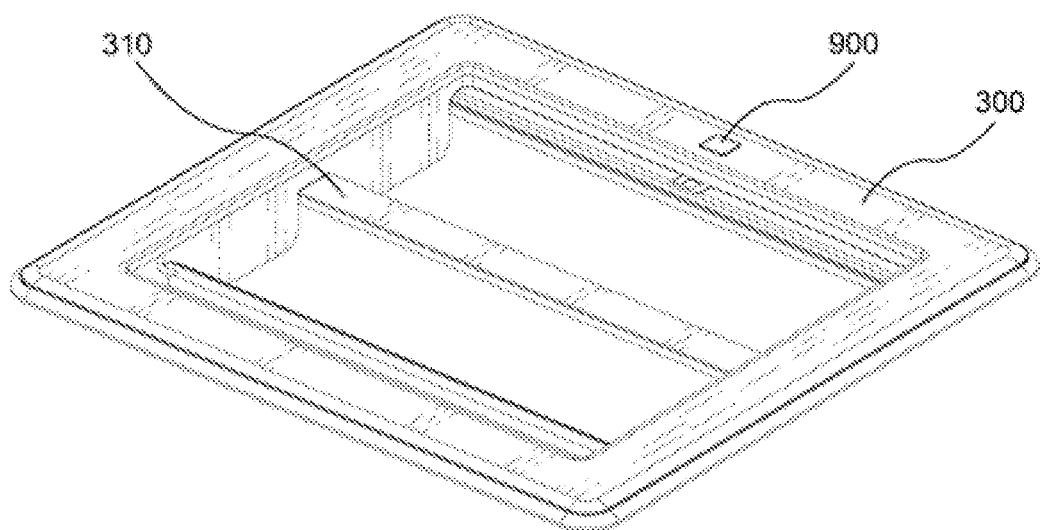
FIG. 26 is a top isometric view of the magnetic bezel of the flip-top in FIG. 1, in accordance with an embodiment of the invention.

FIG. 26 shows a front isometric view of the magnetic bezel 300. In some embodiments, the crossbar 310 of magnetic bezel 300 may act to conceal any included module locking bars 701 (shown in FIG. 9). Lid release button 900 is exposed through magnetic bezel 300.

Figure 27:
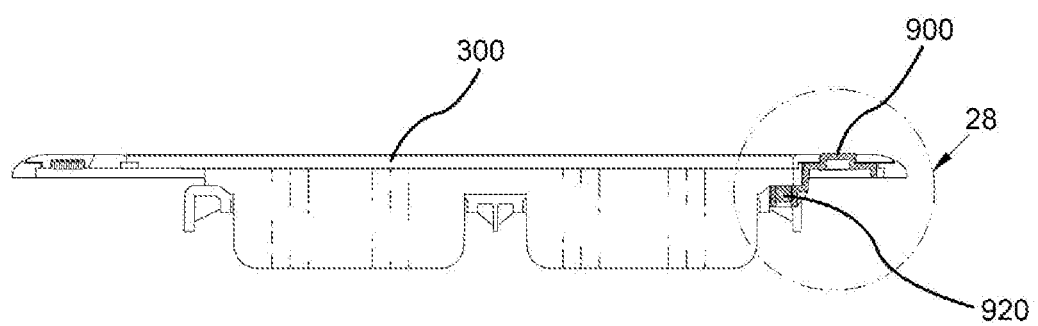
FIG. 27 is a side sectional view of the magnetic bezel in FIG. 26 showing the release button assembly of the lid, in accordance with an embodiment of the invention.

FIG. 27 shows an embodiment of a the magnetic bezel in FIG. 26 showing a release button assembly that includes a lid release button 900 connected to a lid release button assembly magnet 920.

Figure 28:
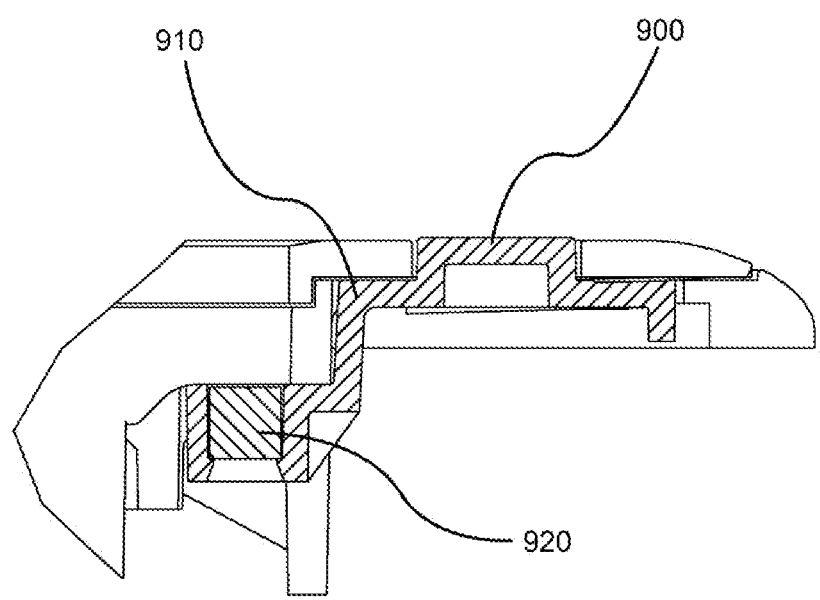
FIG. 28 is a portion of the side view of the magnetic bezel in FIG. 27 enlarged for magnification purposes
Figure 29:
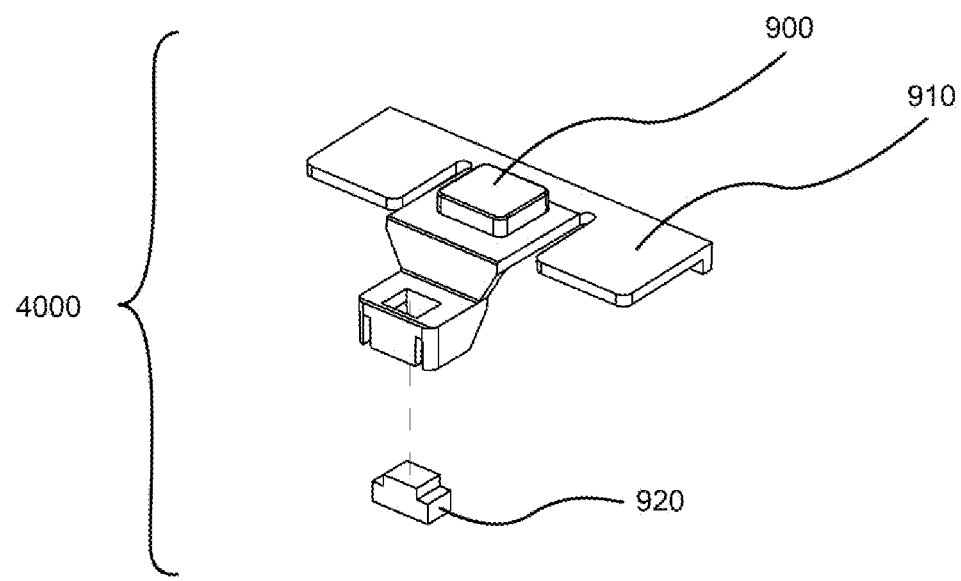
FIG. 29 is an exploded isometric view of the release button assembly showing the magnet used to capture and hold the lid in the closed position, in accordance with an embodiment of the invention.

Now referring to FIG. 28, (portion of FIG. 27 enlarged for magnification), pressing the lid release button exposed through the top surface of the magnetic bezel causes the lid release button assembly 910 and its embedded lid release button assembly magnet 920 to pitch downwardly and away from any lid or steal insert included thereon. It is preferable that a flip-top lid can held in the closed position by the magnetic grabbing force of magnet 920, and be released by pitching magnet 920 downwardly. The release occurs because the distance between the magnet and lid is increased when pitching magnet 920 down thus allowing the torsion spring's bias to overcome the magnetic field of the distanced lid release button assembly magnet 920. FIG. 29 shows an exemplary embodiment of a lid release button assembly 910 showing a magnet 920 used to capture and hold a lid in the closed position.

In an embodiment, the flip-top enclosure may have a control system installed within its frame. The control system could be used to communicate with a conference room head-end, for example, to provide control commands to one or more information sources. Examples of information sources include DVD players, television receivers, video cameras, cd players, networked media servers, laptop computers, tablets, mobile phones, and the like.

Figure 30:
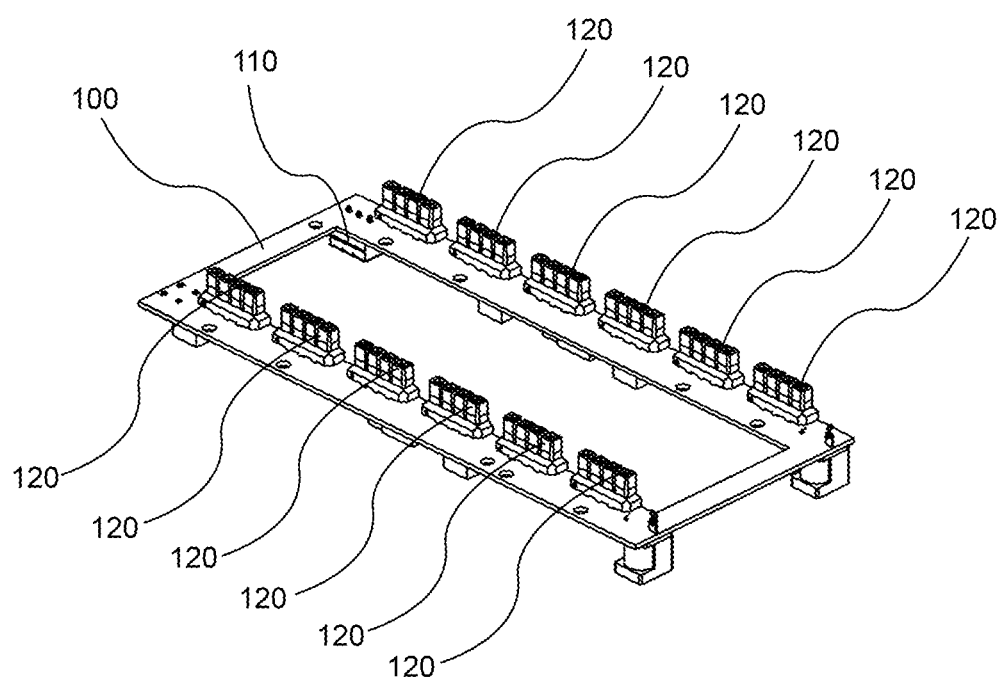
FIG. 30 is a front isometric view showing the bus board, in accordance with an embodiment of the invention.

FIG. 30 shows a bus board for use in a flip-top enclosure according to one embodiment. In this embodiment, one or more module inserts can be configured with a bus board connector that connects to a bus board module connector 120 when the module is inserted into a flip-top enclosure. Embodiments utilizing module guides and module rails ensure that the bus board connector and bus board module connector 120 are properly aligned during module insert insertion. The use of module locking bars 701 (e.g., FIG. 9) further ensures that module inserts are not accidentally pulled out of the flip-top enclosure.

Figure 31:
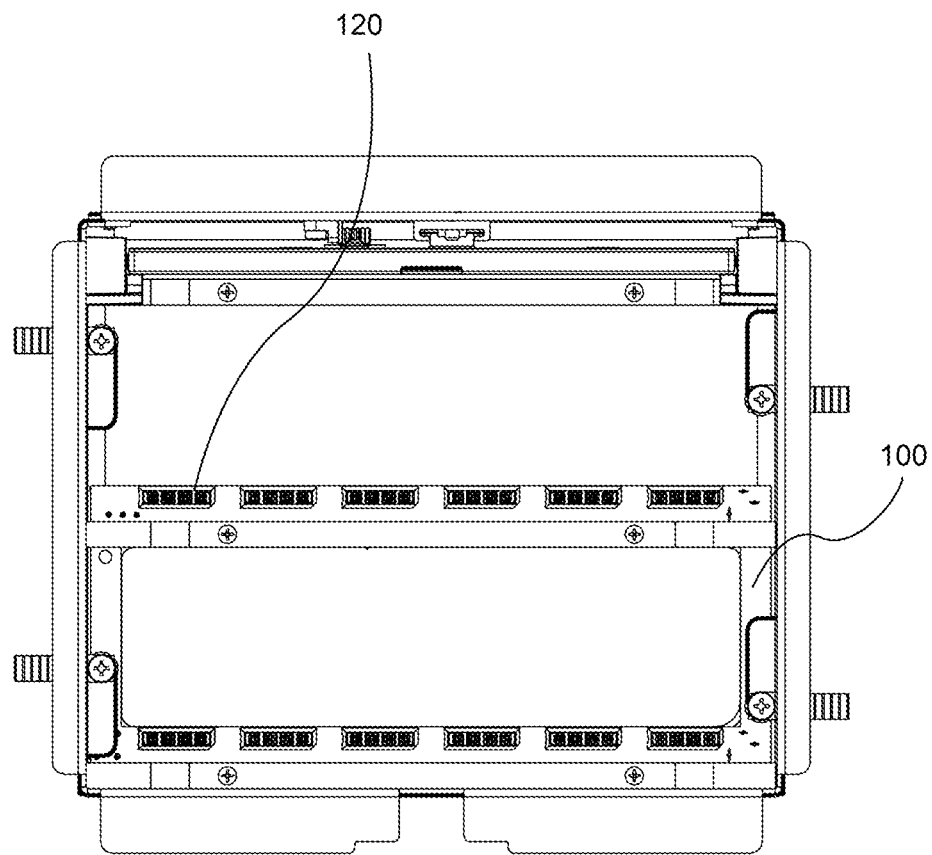
FIG. 31 is a top view showing the exposed bus board module connectors of the bus board Assembly as installed within the flip-top in FIG. 1, in accordance with an embodiment of the invention.

FIG. 31 shows a top view of the exposed bus board module connectors 120 of the bus board assembly 100 as installed within a flip-top. In some embodiments a module insert's bus board connector mates with one of the corresponding exposed bus board module connectors 120.

Figure 32:
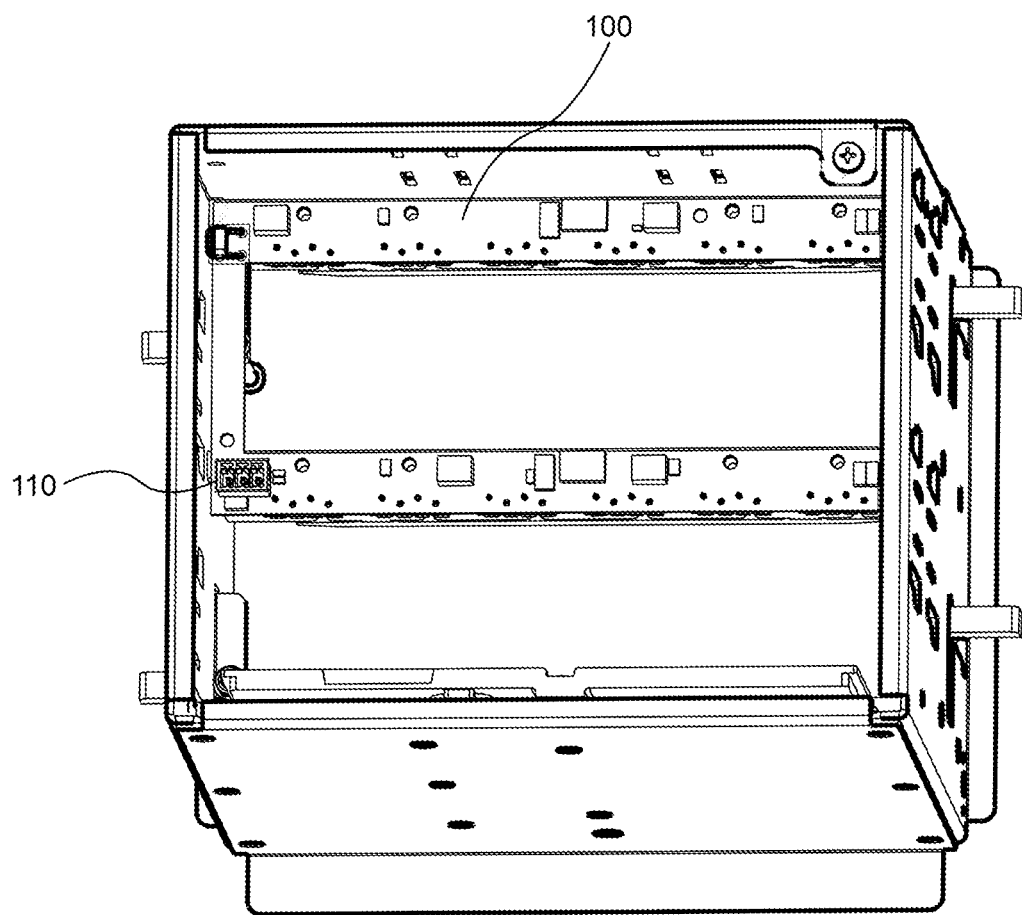
FIG. 32 is a bottom isometric view showing the bus board Module Data connector of the bus board Assembly as installed within the flip-top in FIG. 1, in accordance with an embodiment of the invention.
Figure 33:
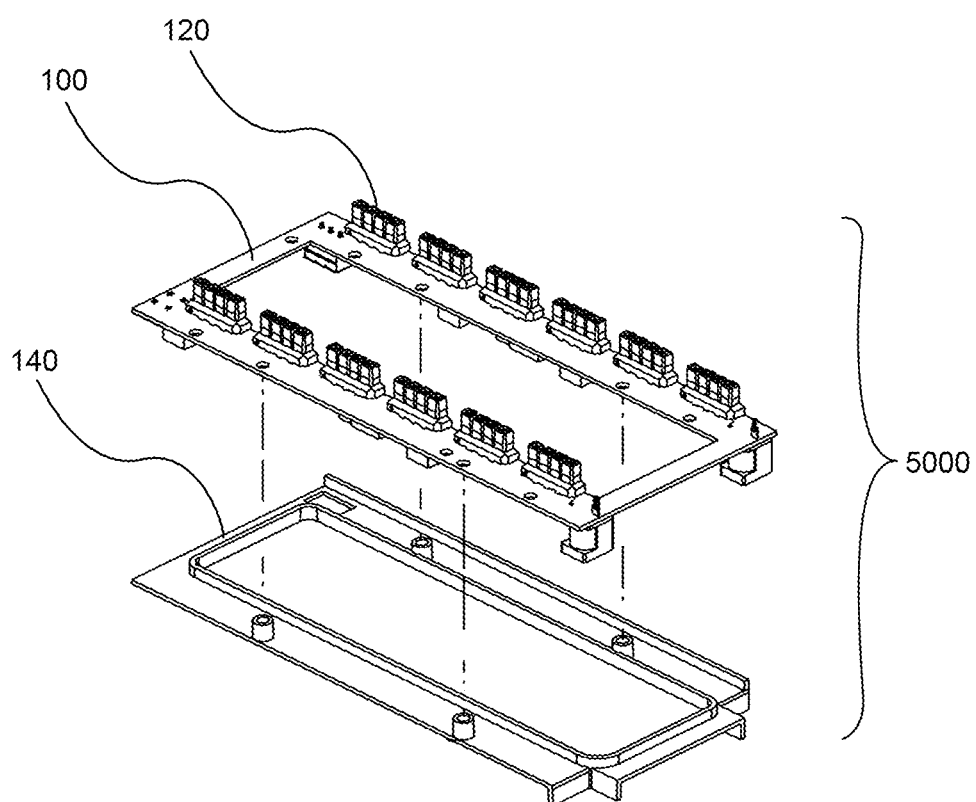
FIG. 33 is a front exploded isometric view showing the bus board and bus board cover, in accordance with an embodiment of the invention.
Figure 34:
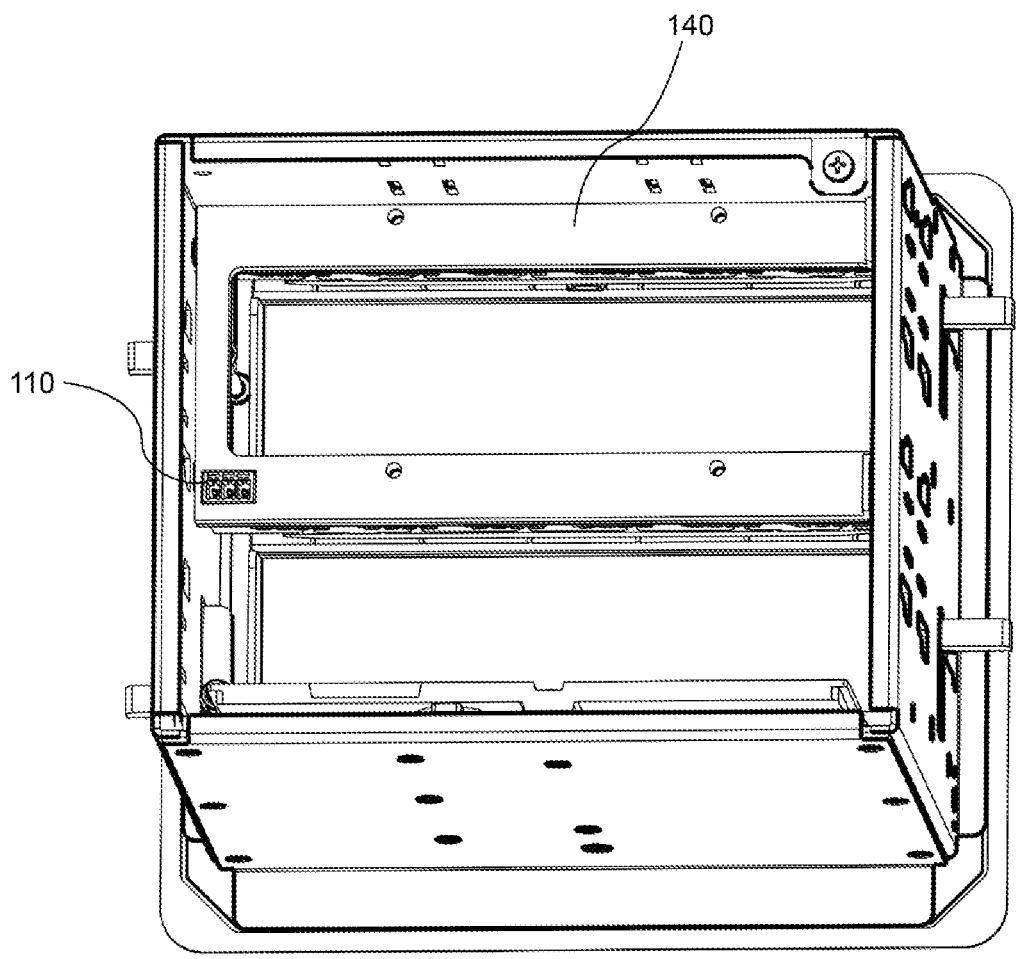
FIG. 34 is a bottom isometric view showing the bus board cover installed over the bus board, in accordance with an embodiment of the invention.

As shown in FIG. 32, the bottom of bus board assembly 100, as installed, includes a bus board data connector 110. In some embodiments, bus board data connector 110 is provided to enable a data controller or control computer to pass bidirectional data to or from any installed module insert. As shown in FIG. 33, some embodiments may include a bus board cover 140. Bus board cover 140 may be used to secure bus board 100 into the flip-top enclosure as shown in FIG. 34.

Figure 35:
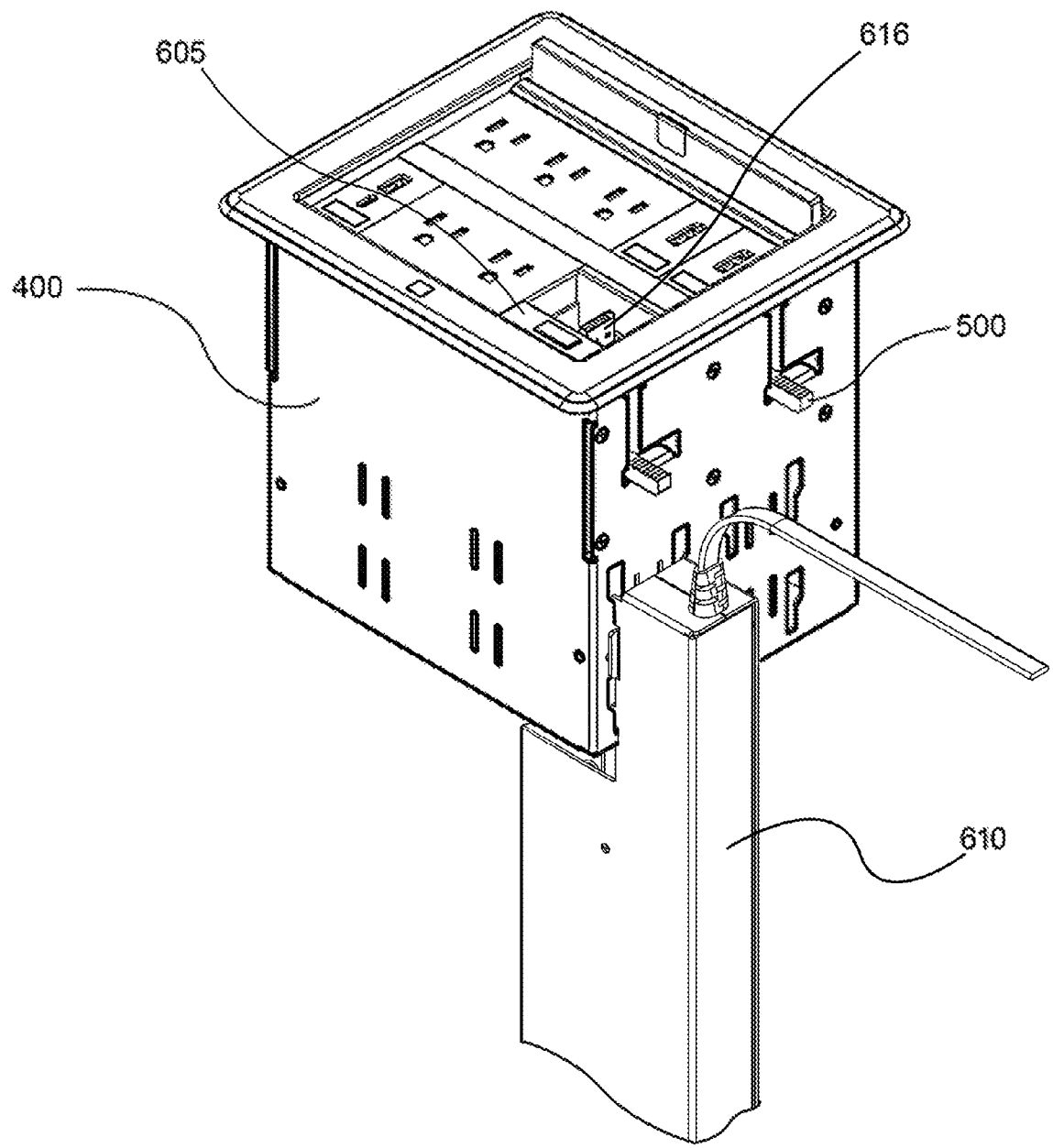
FIG. 35 is a front isometric view of a flip-top having a retractor enclosure attached thereto in accordance with an embodiment of the invention.

FIG. 35 shows a flip-top having with a retractor enclosure 610 attached to the flip-top frame 400. The flip-top is equipped with retractor module insert 605. The retractor enclosure 610 provides a cable having a cable end plug 616, which is pulled through a retractor module insert door 615 (shown in FIG. 45) of, said retractor module insert 605.

Figure 36:
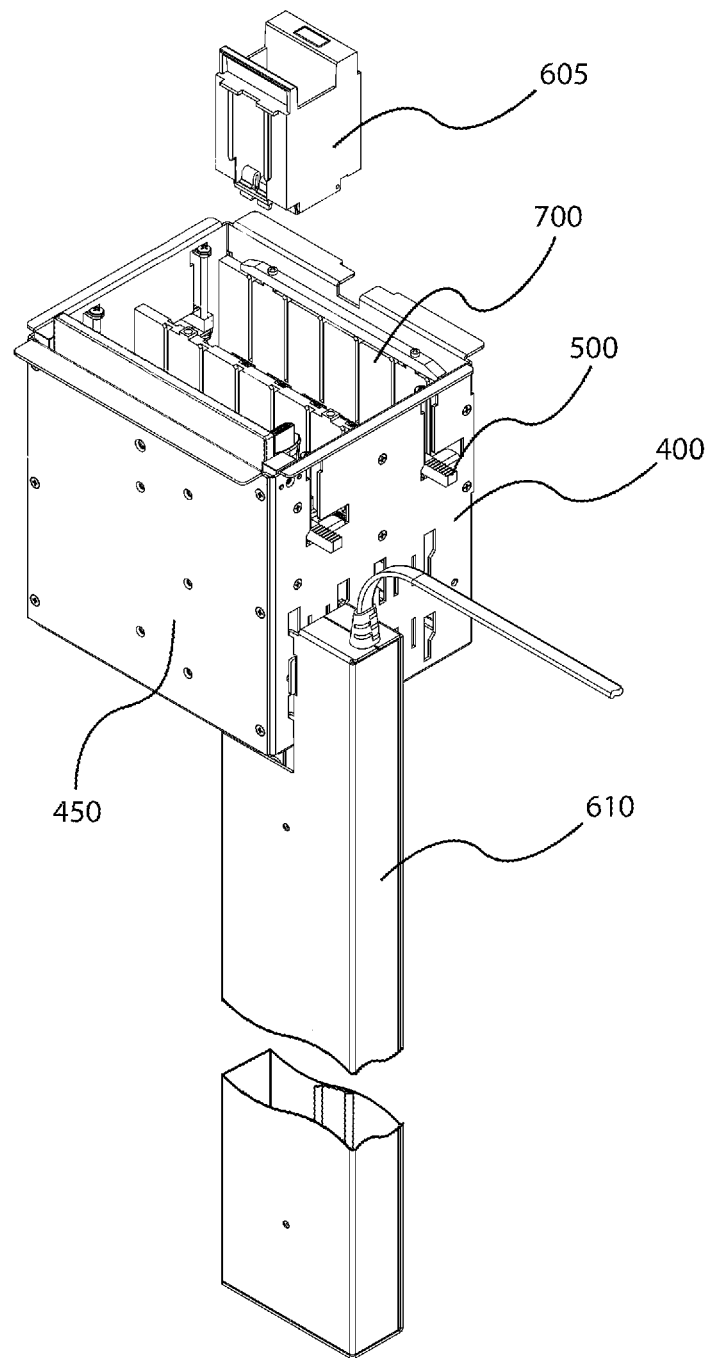
FIG. 36 is an exploded rear isometric view of a flip-top showing a retractor module insert and a retractor enclosure secured to the opposite side than that of shown in FIG. 35.
Figure 45:
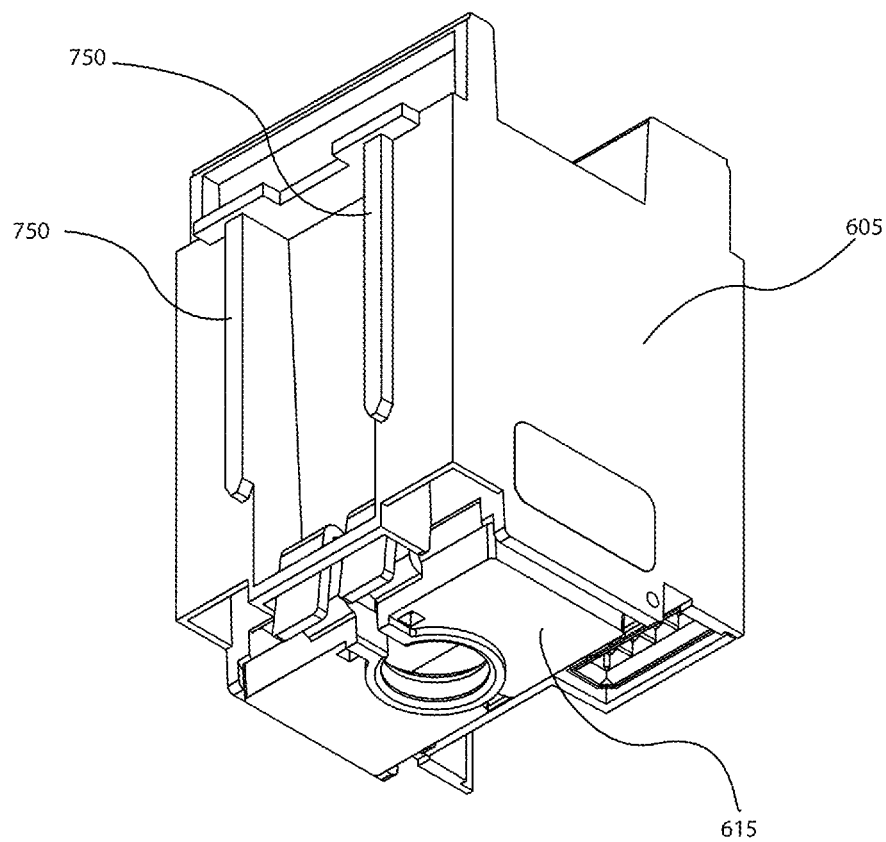
FIG. 45 is a bottom front isometric view of a retractor module insert, in accordance with an embodiment of the invention.

FIG. 36 is an exploded rear isometric view of the flip-top in FIG. 35 showing retractor module insert 605 before cable end plug 616 is passed through the retractor module insert door 615 (e.g., FIG. 45). The module guides 700 help align the insertion of retractor module insert 605.

Figure 37:
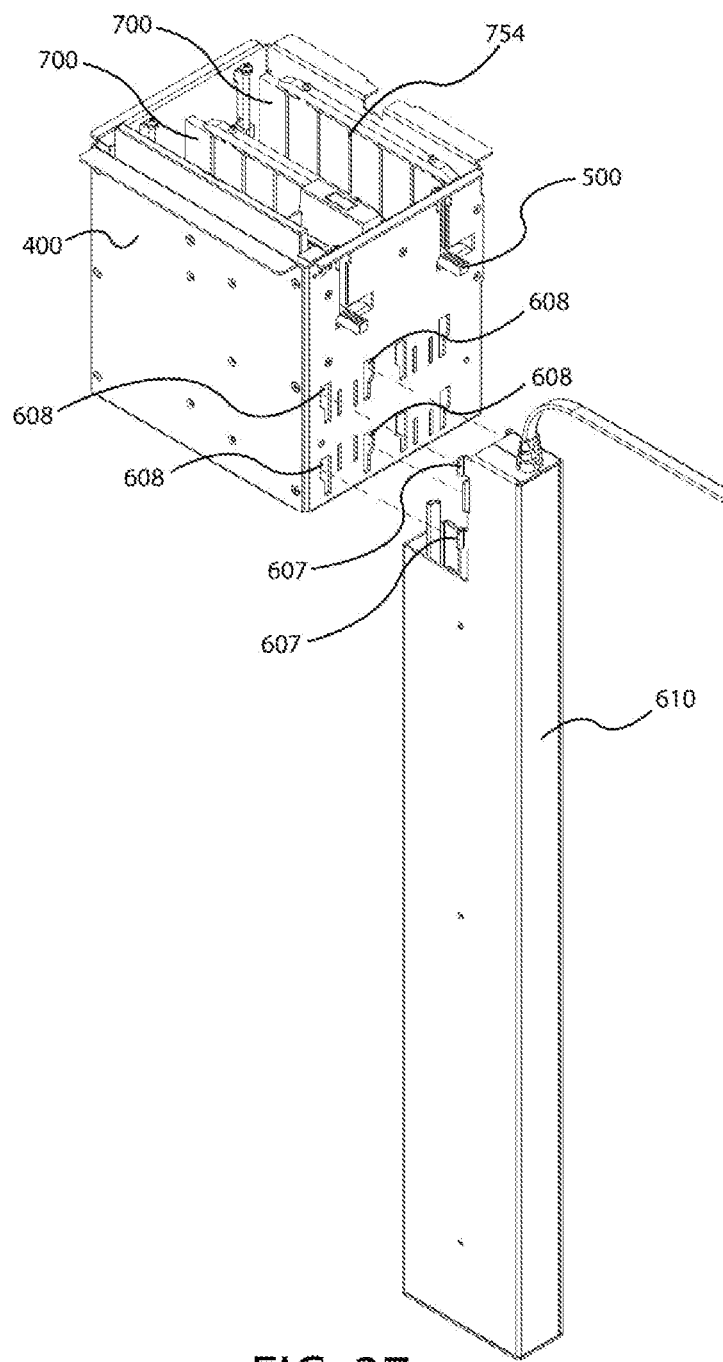
FIG. 37 is an exploded rear isometric view of a flip-top with a retractor enclosure in accordance with an embodiment of the invention.

FIG. 37 shows how retractor enclosure 610 is secured to the flip-top frame 400. Frame locking slots 608 receive one or more aligned retractor enclosure locking tabs 607. Frame locking slots 608 are narrower at their bottom, causing retractor enclosure locking tabs 607 to interlock when dropped behind the narrow portion of frame locking slots 608.

Figure 38:
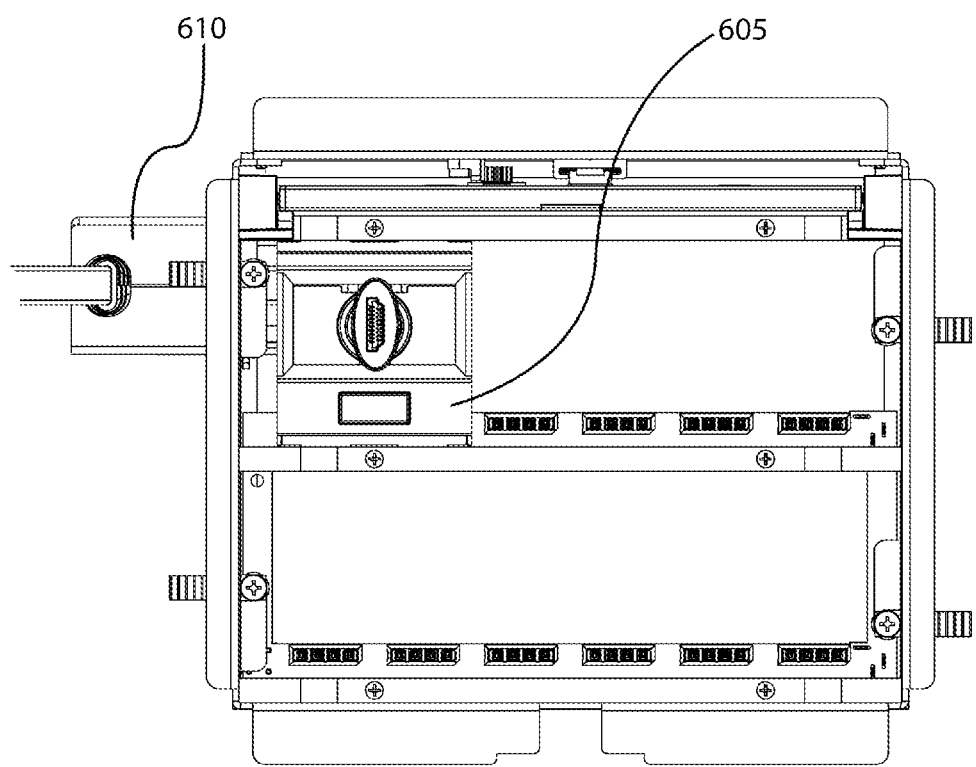
FIG. 38 is a top view of a flip-top and an attached retractor enclosure, in accordance with an embodiment of the invention.

FIG. 38 show a top view of the flip-top with the retractor enclosure 610 secured. As can be seen, retractor module insert 605 has cable end plug 616 passed through retractor module insert door 615 (e.g., FIG. 45).

Figure 39:
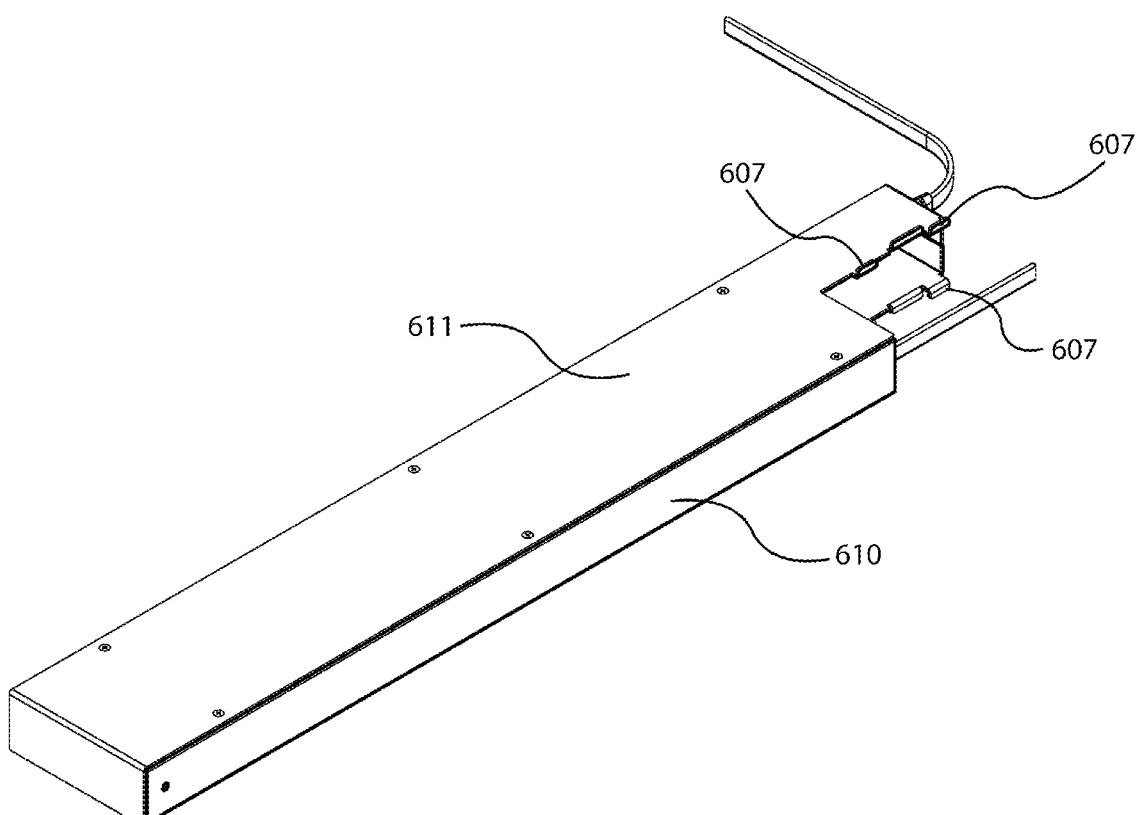
FIG. 39 is an isometric view of the retractor enclosure, in accordance with an embodiment of the invention.

FIG. 39 is an isometric view of retractor enclosure 610 showing the retractor enclosure cover 611.

Figure 40:
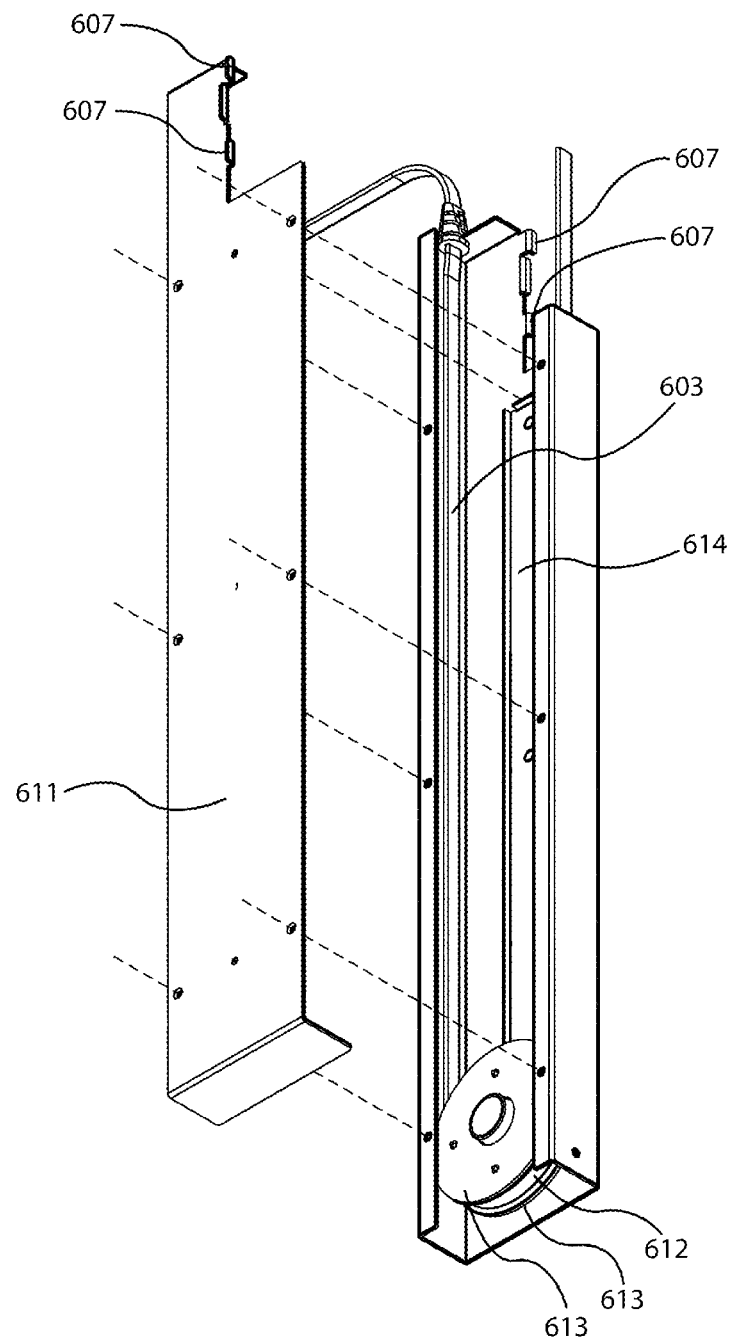
FIG. 40 is an exploded front isometric view of the retractor enclosure, in accordance with an embodiment of the invention.
Figure 41:
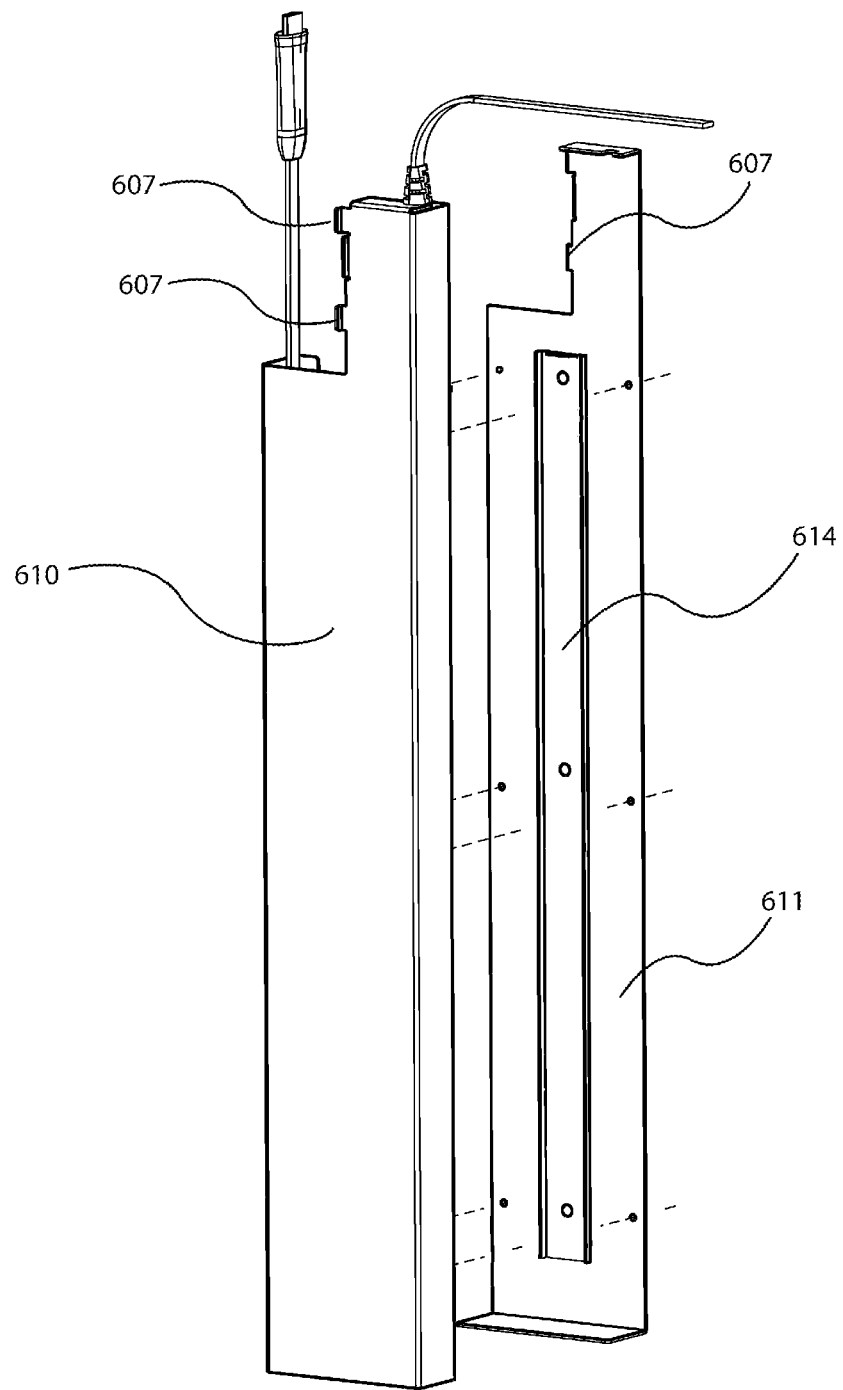
FIG. 41 is an exploded rear isometric view of the retractor enclosure shown in FIG. 40, in accordance with an embodiment of the invention.

FIG. 40 has said retractor enclosure cover 611 exploded from retractor enclosure 610. Cable pulley 612 has a weighted disk 613 secured to both sides. Each side of cable pulley 612 rides within enclosure cable pulley guide rail 614. Retractor enclosure 610 has a gravity retractor cable 603 anchored at one end, which passes underneath cable pulley 612 before exiting from the top of retractor enclosure 610. Gravitational forces act upon cable pulley 612 causing gravity retractor cable 603, which passes underneath said cable pulley 612, to retract back into retractor enclosure 610. However, when retractor cable 612 is pulled out from retractor enclosure 610 the length of gravity retractor cable 603 remaining within retractor enclosure 610 decreases, thereby causing cable pulley 612 to be pulled upward, along enclosure cable pulley guide rail 614. FIG. 41 shows the opposing cable pulley guide rail 614 that is secured to retractor enclosure cover 611.

Figure 42:
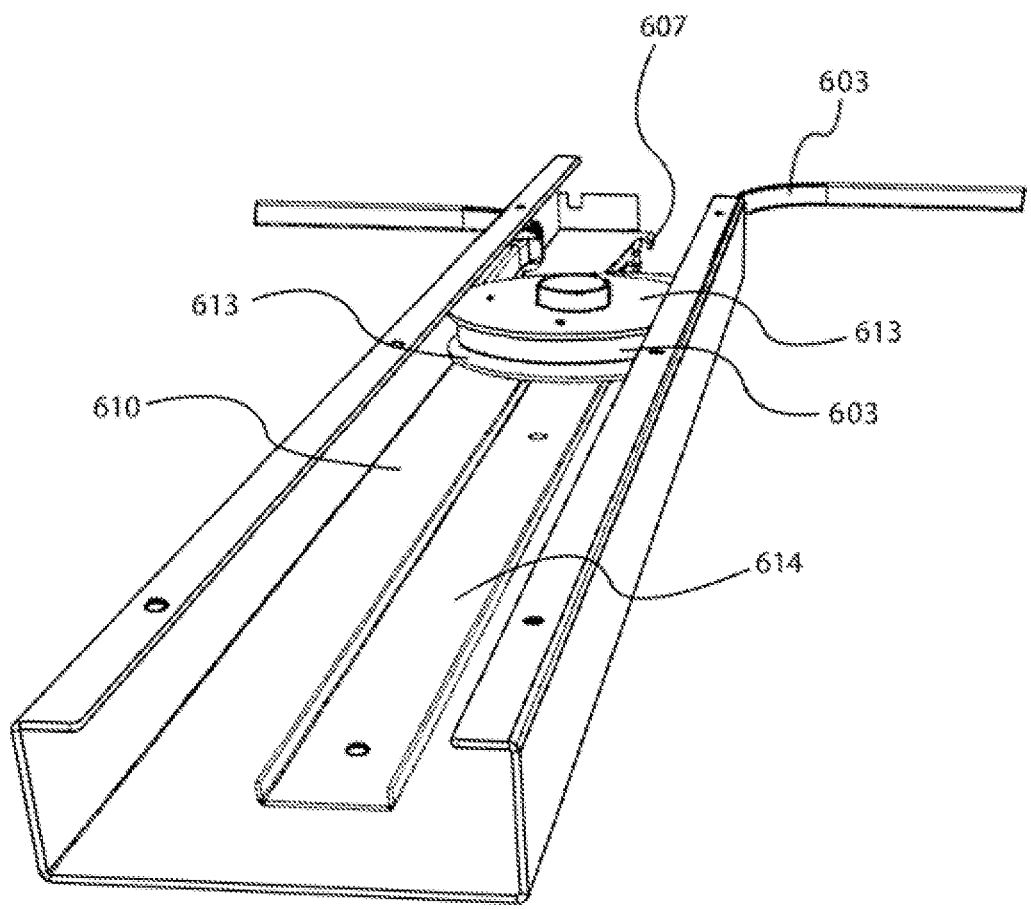
FIG. 42 is a perspective view of a retractor enclosure with the cover removed showing the cable pulley interacting with one of the enclosure cable pulley guide rails, in accordance with an embodiment of the invention.

FIG. 42 is a view of a retractor enclosure 610 with the cover removed showing the cable pulley 612 riding along enclosure cable pulley guide rail 614 according to the amount of gravity retractor cable 603 that is retracted.

Figure 43:
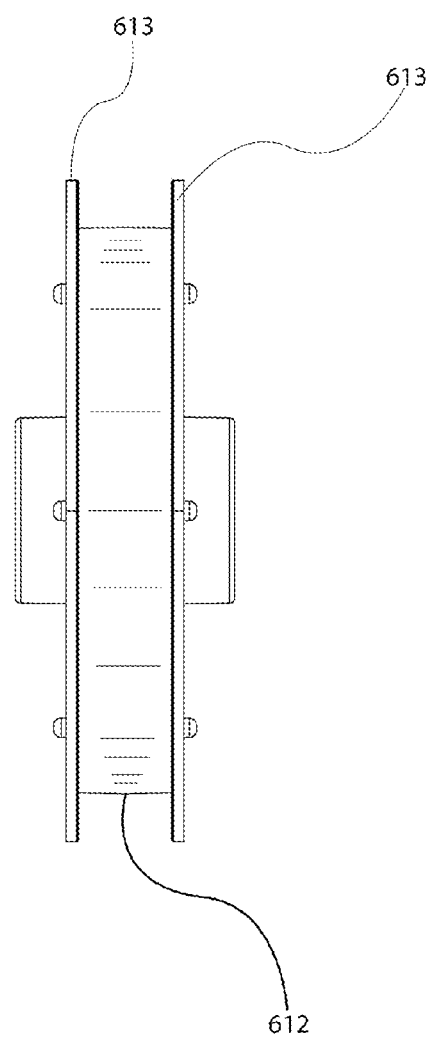
FIG. 43 is a side view of a cable pulley, in accordance with an embodiment of the invention.
Figure 44:
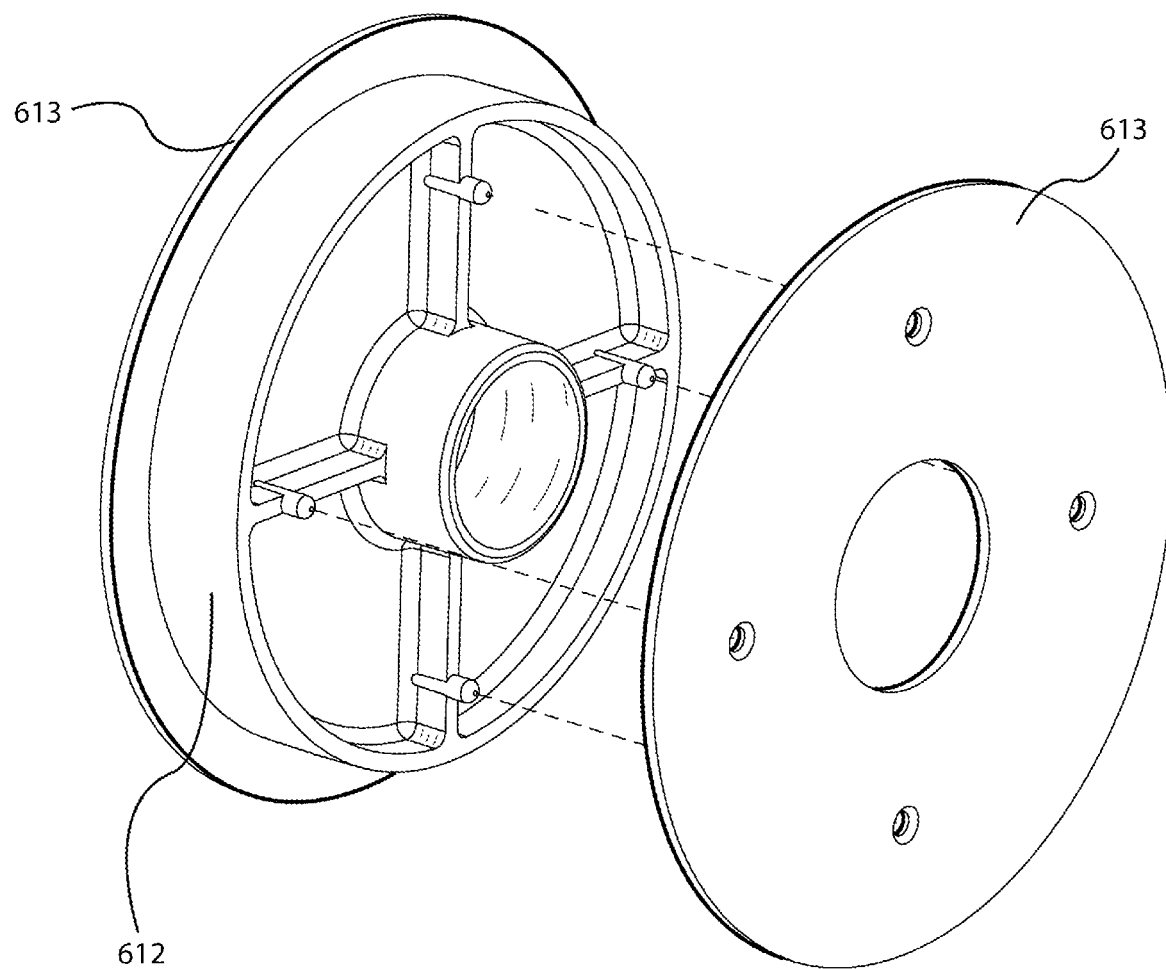
FIG. 44 is an exploded view of the cable pulley of FIG. 43, in accordance with an embodiment of the invention.

FIG. 43 shows a cable pulley 612 having a weighted disk 613 at each end. As can be seen in FIG. 44, the weighted disk 613 can be interchanged with another having a different weight, for example. The greater the weight, the greater the retraction caused by the gravitational bias cable pulley 612 has on gravity retractor cable 603.

Figure 46:
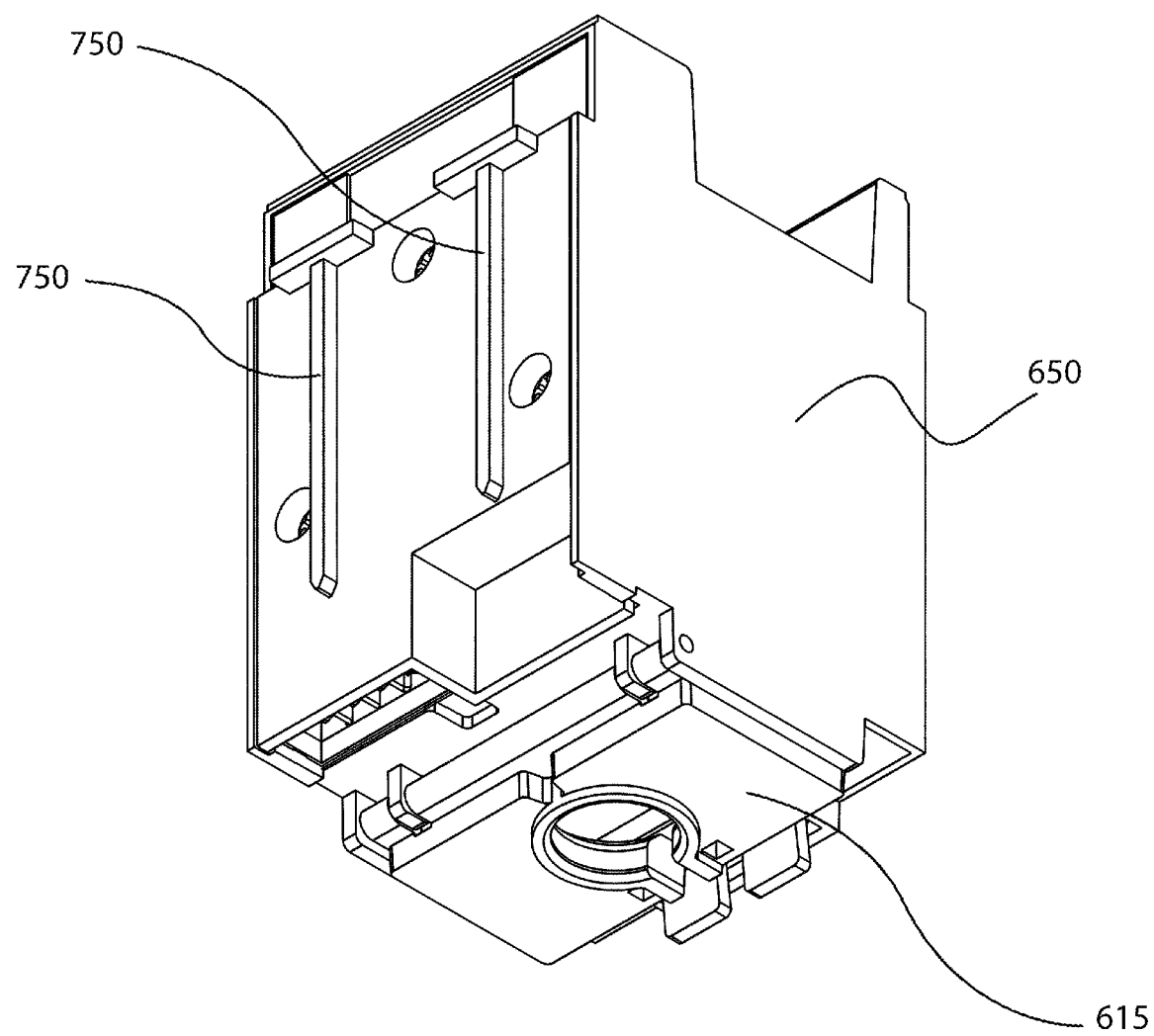
FIG. 46 is a bottom rear isometric view of the retractor module insert of FIG. 45.

FIG. 45 shows the retractor module insert door 615 of retractor module insert 605. Cable end plug 616 is larger in diameter than the opening in retractor module insert door 615. Therefore, after gravity retractor cable 603 is passed though the slot to the center of the round opening of retractor module insert door 615, cable end plug 616 will become retained by retractor module insert door 615, after retractor module insert door 615 is closed. When the door is closed, the retractor module insert door slot is no longer available because it is blocked off by the side of retractor module insert 605. FIG. 46 shows the rear isometric view of the retractor module insert in FIG. 45.

Figure 47:
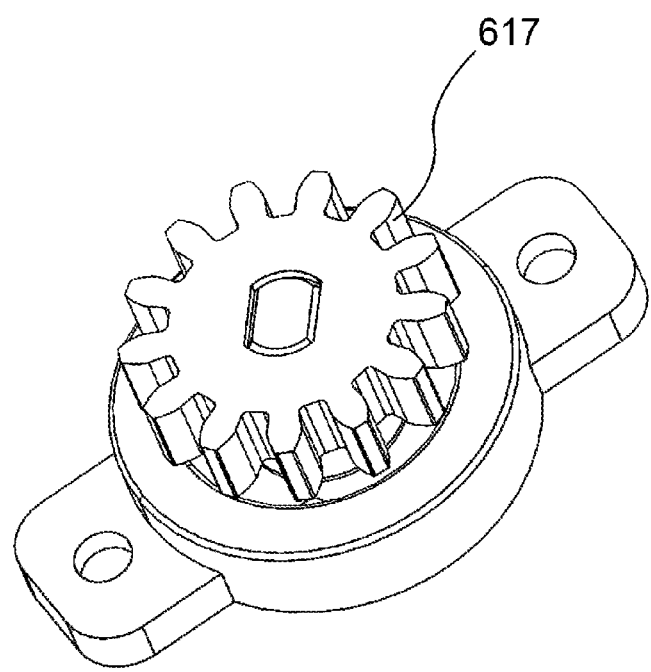
FIG. 47 is a perspective view of a Pulley Rotational Dampener, in accordance with an embodiment of the invention.

FIG. 47 shows a Pulley Rotational Dampener 617. In some embodiments, Pulley Rotational Dampener 617 is used to dampen the bias cable pulley 612 (shown in FIG. 43) exerts on gravity retractor cable 603 (shown in FIG. 42).

Figure 48:
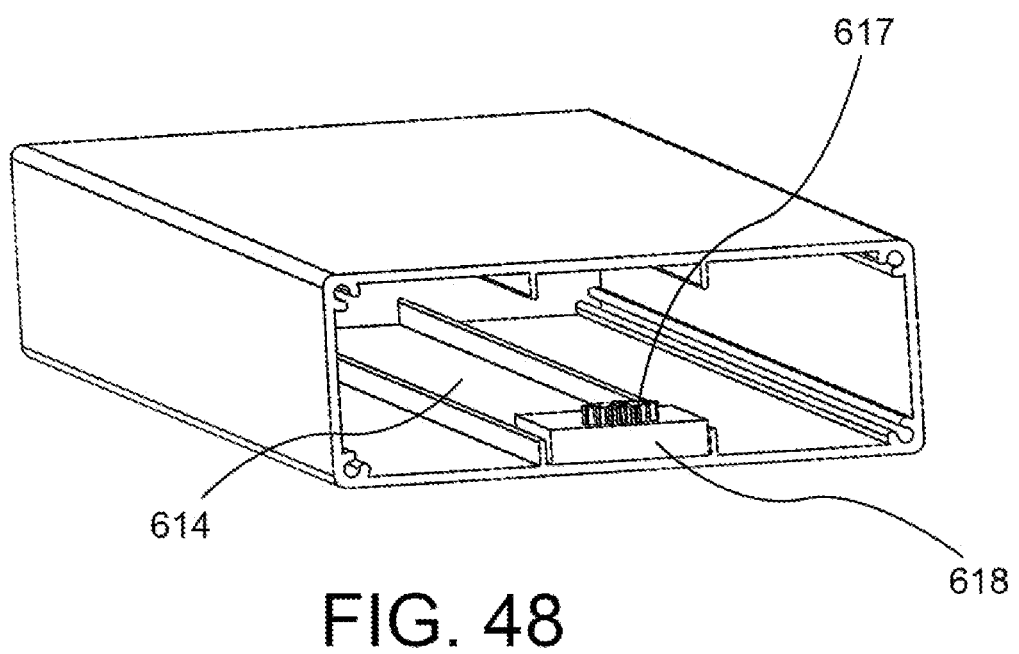
FIG. 48 is a perspective view of a retractor enclosure using a Pulley Rotational Dampener and Pulley Rotational Dampener Guide Block, in accordance with alternate embodiment of the invention.

FIG. 48 is a perspective view of a retractor enclosure utilizing a pulley rotational dampener and pulley rotational dampener guide block. Pulley rotational dampener guide block 618 rides within enclosure cable pulley guide rail 614. While Pulley rotational dampener guide block 618 rides within enclosure cable pulley guide rail 614 said pulley rotational dampener guide block 618 is restricted from rotating, that is, it can only slide.

Figure 49:
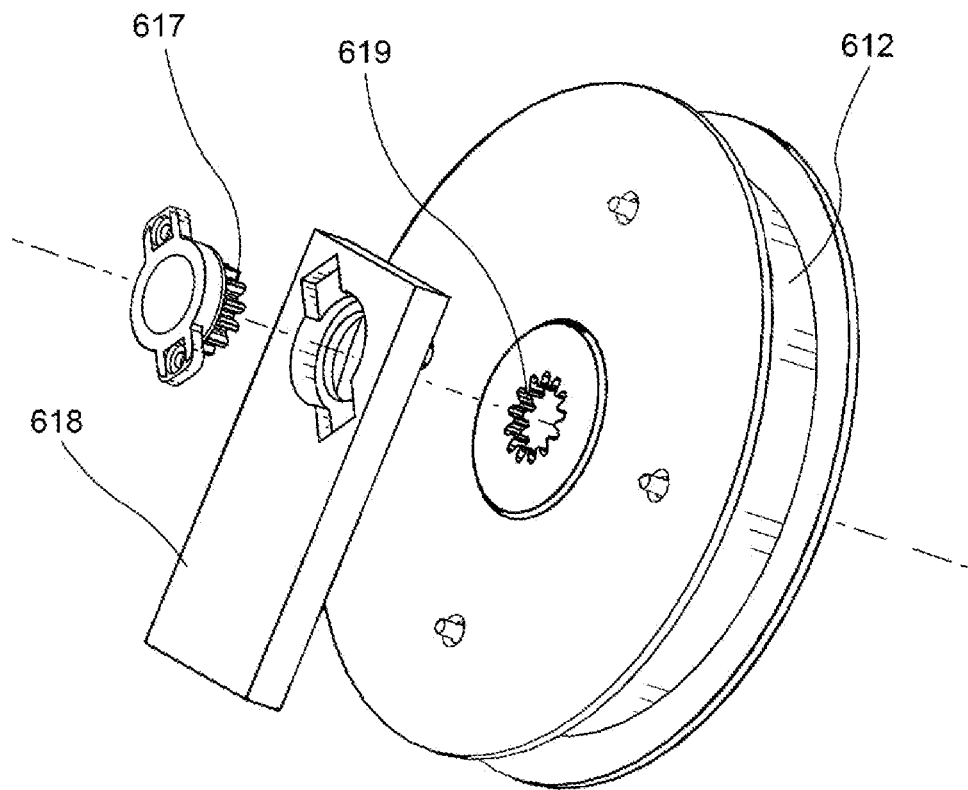
FIG. 49 shows an exploded partial view of the Pulley Rotational Dampener, Pulley Rotational Dampener Guide Block, and Cable Pulley with Teeth in accordance with an alternate embodiment of the invention.
Figure 50:
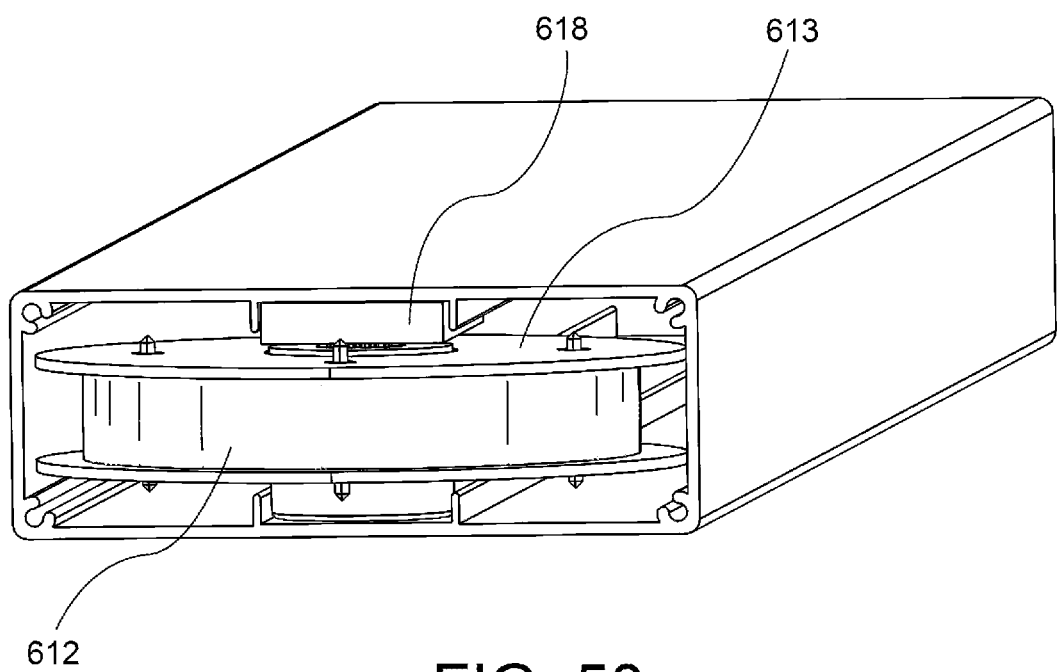
FIG. 50 is a perspective view of a retractor enclosure using a Pulley Rotational Dampener, Pulley Rotational Dampener Guide Block, and Cable Pulley with Teeth, in accordance with alternate embodiment of the invention.

FIG. 49 shows an exploded partial view of the pulley rotational dampener, pulley rotational dampener guide block, and cable pulley with teeth 619. Pulley rotational dampener is coupled to a pulley rotational dampener guide block 618. The pulley rotational dampener 617 has a plurality of gear teeth. Cable pulley with teeth 619 includes a further plurality of gear teeth extending inwardly which engage said plurality of gear teeth of said pulley rotational dampener 617. This mechanical linking allows the pulley rotational dampener 617 to dampen rotation of the cable pulley 612 about its axis;

FIG. 50 is a perspective view of an assembled retractor enclosure (with bottom removed) utilizing a pulley rotational dampener, pulley rotational dampener guide block, and cable pulley with teeth.

Alternate embodiments may be devised without departing from the spirit or the scope of the invention. For example, cable end plug of the gravity retractor cable (or any module receptacle) can be one of any commonly used types such as, Universal Serial Bus (USB) A-Type, USB B-Type, USB C-Type, USB Micro, USB Mini, RS-232, DB-25F serial port, D-Subminiature (DB)-9, DB-15, DB-25, DB-37, 20-pin Thunderbolt, 24-pin Thunderbolt, 4-pin FireWire (IEEE 1394), 6-pin FireWire (IEEE 1394), 9-pin FireWire (IEEE 1394), High Definition Multimedia Interface (HDMI), Micro HDMI, Mini HDMI, DisplayPort (DP), Mini DP, Digital Visual Interface (DVI)-A (analog), DVI-D (digital), DVI-I (digital and analog), Embedded DisplayPort (eDP), 4-pin Registered Jack (RJ)-11, 6-pin RJ-12, RJ21, 8-pin RJ-45, 8-pin RJ-48, 5-pin Din (Musical Instrument Digital Interface (MIDI), 4-pin Mini DIN (S-Video), 6-pin Mini DIN (PS/2), 7-pin Mini DIN, 8-pin Mini DIN, NEMA 5-15, NEMA 1-15, IEC 320 C5, IEC 320 C7 (non-polarized), IEC 320 C7 (polarized), IEC 320 C13/C14, IEC 60958 type II (SPDIF), Electronic Industries Association of Japan (EIAJ) optical, XLR Connector (IEC 61076-2-103), Radio Corporation of America (RCA) connector, TRS Audio, or any cable type typically desired in a conference, meeting, or presentation room scenario.

It should be understood that this description is not intended to limit the embodiments. On the contrary, the embodiments are intended to cover alternatives, modifications, and equivalents, which are included in the spirit and scope of the embodiments as defined by the appended claims. Further, in the detailed description of the embodiments, numerous specific details are set forth to provide a comprehensive understanding of the claimed embodiments. However, one skilled in the art would understand that various embodiments might be practiced without such specific details.

Although the features and elements of aspects of the embodiments are described being in particular combinations, each feature or element can be used alone, without the other features and elements of the embodiments, or in various combinations with or without other features and elements disclosed herein.

The invention claimed is:

1. A cable retractor, comprising:
   a retractor enclosure having an upper end and a lower end, and including a back surface having a length;
   a retractor enclosure cover having a first interior surface;
   a first enclosure cable pulley guide rail secured to said back surface along the length of the back surface, wherein first enclosure cable pulley guide rail provides a groove that extends along at least a portion of said length of the back surface;
   a second enclosure cable pulley guide rail secured along the length of said first interior surface, wherein said second enclosure cable pulley guide rail provides a groove that extends along at least a portion of said first interior surface;

a cable pulley that is rotatable about a pivot configured to translate along the grooves provided by said first enclosure cable pulley guide rail and said second enclosure cable pulley guide rail;

a pulley rotational dampener guide block;

a pulley rotational dampener secured to said pulley rotational dampener for mechanically engaging said cable pulley and thereby dampen rotation of said cable pulley about its axis; and a gravity retractor cable having an intermediate section secured to said upper end of said retractor enclosure, a second portion disposed along an edge of said retractor enclosure towards the lower end of said retractor enclosure, a third portion that winds down underneath and around said cable pulley, a fourth portion disposed along the edge of said retractor enclosure towards the upper end of said retractor enclosure, and an extracted portion having a cable end plug that extends outside of said retractor enclosure from said upper end, such that pulling the end portion of the cable away from said retractor enclosure urges said cable pulley upward along enclosure cable pulley guide rails toward the upper end of enclosure cable pulley guide rail, thereby reducing the lengths of the second and fourth portions of the cable and increasing the length of said extracted portion of the cable;

wherein upon termination of the pulling of the cable, bending and friction of the cable prevent movement of the pulley, and upon reducing the bending and friction of the cable, the gravitational weight of said pulley causes the pulley to move downward along said grooves toward the lower end of said retractor enclosure, thereby increasing the lengths of the second and fourth portions of the cable and reducing the length of the end portion of the cable.

2. The cable retractor of claim 1, wherein said cable pulley further comprises at a weighted disk secured to one side of said cable pulley for increasing the gravitational weight of said cable pulley.

3. The cable retractor of claim 1, wherein said cable pulley further comprises at a weighted disk secured to each side of said cable pulley for increasing the gravitational weight of said cable pulley.

4. The cable retractor according to claim 1, further comprising wherein said cable end plug complies with a specification selected from a group consisting of: Universal Serial Bus (USB) A-Type, USB B-Type, USB C- Type, USB Micro, USB Mini, RS-232, DB-25F serial port, D-Subminiature (DB)-9, DB-15, DB-25, DB-37, 20-pin Thunderbolt, 24-pin Thunderbolt, 4-pin FireWire (IEEE 1394), 6-pin FireWire (IEEE 1394), 9-pin FireWire (IEEE 1394), High Definition Multimedia Interface (HDMI), Micro HDMI, Mini HDMI, DisplayPort (DP), Mini DP, Digital Visual Interface (DVI)-A (analog), DVI-D (digital), DVI-I (digital and analog), Embedded DisplayPort (eDP), 4-pin Registered Jack (RJ)-11, 6-pin RJ-12, RJ21, 8-pin RJ-45, 8-pin RJ-48, 5-pin Din (Musical Instrument Digital Interface (MIDI), 4-pin Mini DIN (S-Video), 6-pin Mini DIN (PS/2), 7-pin Mini DIN, 8-pin Mini DIN, NEMA 5-15, NEMA 1-15, IEC 320 C5, IEC 320 C7 (non-polarized), IEC 320 C7 (polarized), IEC 320 C13/C14, IEC 60958 type II (SPDIF), Electronic Industries Association of Japan (EIAJ) optical, XLR Connector (IEC 61076-2-103), Radio Corporation of America (RCA) connector, and TRS Audio.

5. A cord retractor for a modular tabletop enclosure, comprising:

retractor channel enclosure forming a an interior channel, the enclosure having a top and a bottom, wherein said top has an opening having one or more retractor channel enclosure locking tabs for interlocking with a flip-top frame;

a first enclosure cable pulley guide rail secured to said interior channel of said retractor channel enclosure, said first enclosure cable pulley guide rail providing a vertical channel;

a retractor enclosure cover having an second interior surface, said second interior surface having a second enclosure cable pulley guide rail secured thereon, said second enclosure cable pulley guide rail providing a vertical channel, wherein said first enclosure cable pulley guide rail and second enclosure cable pulley guide rail are opposing and run parallel to each other, a cable pulley rotatable about a first axis, wherein one side of said cable pulley rides within said first enclosure cable pulley guide rail;

at least one pulley rotational dampener coupled to a pulley rotational dampener guide block, said rotational dampener guide block rides within said second enclosure cable pulley guide rail, wherein said pulley rotational dampener has a plurality of gear teeth, the cable pulley includes a further plurality of gear teeth extending inwardly, and said plurality of gear teeth engage said further plurality of gear teeth and dampen rotation of said cable pulley about its axis;

a weighted disk rotatable about said first axis while secured to said cable pulley for adding additional weight to said cable pulley;

a gravity retractor cable having an intermediate storage section, wherein one end of the storage section is fixed to said top of retractor channel enclosure and the other end of the storage section comprising a free end which extends outwardly from said top of retractor channel enclosure, the cord storage section being at passed under said cable pulley, wherein the gravitational weight of said cable pulley biases said gravity retractor cable to retract into said a retractor enclosure.

6. A modular tabletop enclosure for housing one or more retractor module inserts comprising:

a housing back;

a profile guide rail mounted to said housing back, whereby said profile guide rail provides a vertical channel, a rack gear mounted to said housing back;

a lid assembly comprised of a lid and a lid carrier, wherein said lid is pivotally secured to a lid carrier with a hinge pin positioned through a torsion spring, said torsion spring being tensioned to springably bias said lid to stand parallel with said lid carrier;

a linear guide carriage mounted to said lid carrier for slidably engaging within said vertical channel of said profile guide rail, a rotary Dampener mounted to rear of said lid carrier to provide linear dampening by rotatably engaging along the length of said rack gear;

a frame secured to said housing back to form an enclosed area having a plurality of frame locking slots for receiving one or more retractor channel enclosure locking tabs;

a module guide having a plurality of module rail grooves for mating with a module rail of said one or more module inserts;

a door guide block attached to each top rear surface of said frame for allowing said lid assembly to recess only after it is fully extended and parallel to said lid, and for slidably engaging lid during its recess into said modular tabletop enclosure;

a retractor module insert having bottom and top, said bottom comprising a retractor module insert door;

a retractor enclosure having an upper end and a lower end, and including a back surface having a length;

a retractor enclosure cover having a first interior surface;

a first enclosure cable pulley guide rail secured to said back surface along the length of the back surface, wherein first enclosure cable pulley guide rail provides a groove that extends along at least a portion of said length of the back surface;

a second enclosure cable pulley guide rail secured along the length of said first interior surface, wherein said second enclosure cable pulley guide rail provides a groove that extends along at least a portion of said first interior surface;

a cable pulley that is rotatable about a pivot configured to translate along the grooves provided by said first enclosure cable pulley guide rail and said second enclosure cable pulley guide rail;

at least one pulley rotational dampener coupled to a pulley rotational dampener guide block the pulley rotational dampener having a plurality of gear teeth; wherein the cable pulley includes a further plurality of gear teeth extending inwardly, wherein said plurality of gear teeth engage said further plurality of gear teeth and dampen rotation of said cable pulley about its axis;

a gravity retractor cable having an intermediate section secured to said upper end of said retractor enclosure, a second portion disposed along an edge of said retractor enclosure towards the lower end of said retractor enclosure, a third portion that winds down underneath and around said cable pulley, a fourth portion disposed along the edge of said retractor enclosure towards the upper end of said retractor enclosure, and an extracted portion having a cable end plug that extends outside of said retractor enclosure from said upper end, such that pulling the end portion of the cable away from said retractor enclosure urges said cable pulley upward along enclosure cable pulley guide rails toward the upper end of enclosure cable pulley guide rail, thereby reducing the lengths of the second and fourth portions of the cable and increasing the length of said extracted portion of the cable; and wherein upon termination of the pulling of the cable, bending and friction of the cable prevent movement of the pulley, and upon reducing the bending and friction of the cable, the gravitational weight of said pulley causes the pulley to move downward along said grooves toward the lower end of said retractor enclosure, thereby increasing the lengths of the second and fourth portions of the cable and reducing the length of the end portion of the cable.

7. The modular tabletop enclosure according to claim 6, wherein said module rail grooves are shaped to require proper orientation of said retractor module insert in order to mate with said module rail of said module inserts.

8. The modular tabletop enclosure according to claim 6 wherein said module rail is shaped to require proper orientation of said retractor module insert in order to mate with said module rail grooves of said module rails.

9. The modular tabletop enclosure according to claim 8 wherein said lid further comprises a first and second side, said first and second side each having a channel extending along the length of said each first and second side of said lid such that a door guide block engages each channel of first and second side while said lid is recessing downwardly in to said tabletop enclosure.

10. The modular tabletop enclosure according to claim 9, wherein said frame further comprises one or more dog-ears, wherein said dog-ears are rotatable between a first position where they lie within the perimeter of said frame such that insertion and removal of said tabletop enclosure permitted, and a second position where they extend outwardly from said frame to secure said tabletop enclosure within an opening cut through a tabletop surface when said frame is recessed through said opening and below said tabletop surface.

11. The modular tabletop enclosure of claim 9, wherein said lid further comprises a steel insert; and A lid release button assembly, further comprising a inwardly protruding lid release button assembly magnet for magnetically capturing said steel insert of said lid, whereby depressing said lid release button causes said lid release button assembly and said lid release button assembly magnet to pitch downwardly and away from said steel insert thereby releasing said lid when said lid release button is depressed.

12. The modular tabletop enclosure of claim 11, in whereby when said lid is in the closed position, depressing said lid release button lid automatically, without any additional user intervention, causes said lid to spring open and then autonomously recess by sliding downwardly in a smooth controlled manner into the modular tabletop enclosure until it is substantially recessed.

13. The modular tabletop enclosure of claim 6, wherein said rotary dampener provides dampening forces to permit said lid assembly to recess at a smooth rate of decent into said modular tabletop enclosure and said linear guide carriage provides linear guidance for the lid assembly's decent during said recess.

\* \* \* \* \*